(12) United States Patent
Heo et al.

(10) Patent No.: US 12,456,718 B2
(45) Date of Patent: Oct. 28, 2025

(54) LED DISPLAY DEVICE HAVING A BARRIER METAL LAYER AND METHOD OF FABRICATING THE SAME

(71) Applicant: Samsung Display Co., LTD., Yongin-si (KR)

(72) Inventors: Eui Kang Heo, Yongin-si (KR); Young Seok Baek, Yongin-si (KR); Ha Na Seo, Yongin-si (KR); Chong Sup Chang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 461 days.

(21) Appl. No.: 17/832,079

(22) Filed: Jun. 3, 2022

(65) Prior Publication Data

US 2023/0122457 A1  Apr. 20, 2023

(30) Foreign Application Priority Data

Oct. 18, 2021  (KR) .................. 10-2021-0138780

(51) Int. Cl.
*H01L 25/16* (2023.01)
*H01L 23/00* (2006.01)
(Continued)

(52) U.S. Cl.
CPC ............ *H01L 25/167* (2013.01); *H01L 24/95* (2013.01); *H10D 86/021* (2025.01); *H10D 86/441* (2025.01); *H10D 86/60* (2025.01); *H01L 24/24* (2013.01); *H01L 24/25* (2013.01); *H01L 2224/24051* (2013.01);
(Continued)

(58) Field of Classification Search
CPC ..... H01L 25/167; H01L 24/95; H01L 27/124; H01L 27/1259; H01L 24/24; H01L 24/25; H01L 2224/24051; H01L 2224/24145; H01L 2224/245; H01L 2224/25175; H01L 2224/95101; H01L 2224/95133; H01L 2924/0542; H01L 2924/0549; H01L 25/0753; H01L 33/58; H01L 33/60;
(Continued)

(56) References Cited

U.S. PATENT DOCUMENTS

2020/0110319 A1\* 4/2020 Kawata ................. G02F 1/1368
2020/0203587 A1\* 6/2020 Kim ..................... H01L 27/156
(Continued)

FOREIGN PATENT DOCUMENTS

KR 10-2021-0065238 6/2021

*Primary Examiner* — Ratisha Mehta
*Assistant Examiner* — Sophia W Kao
(74) *Attorney, Agent, or Firm* — Womble Bond Dickinson (US) LLP

(57) ABSTRACT

A display device may include a conductive pattern disposed on a substrate. A passivation layer may be disposed on the conductive pattern. A first shielding electrode and a second shielding electrode that may be disposed on the passivation layer may be spaced apart from each other. A first electrode may be disposed on the first shielding electrode. A second electrode may be disposed on the second shielding electrode. A light emitting element may be electrically connected between the first electrode and the second electrode. A first distance between the first shielding electrode and the second shielding electrode may be less than a second distance between the first electrode and the second electrode.

17 Claims, 18 Drawing Sheets

(51) Int. Cl.
*H10D 86/01* (2025.01)
*H10D 86/40* (2025.01)
*H10D 86/60* (2025.01)

(52) U.S. Cl.
CPC ............... *H01L 2224/24145* (2013.01); *H01L 2224/245* (2013.01); *H01L 2224/25175* (2013.01); *H01L 2224/95101* (2013.01); *H01L 2224/95133* (2013.01); *H01L 2924/0542* (2013.01); *H01L 2924/0549* (2013.01)

(58) Field of Classification Search
CPC ....... H01L 33/62; H01L 33/387; H01L 33/38; H01L 33/40; H01L 33/52; G09G 3/32
See application file for complete search history.

(56) References Cited

U.S. PATENT DOCUMENTS

| | | | |
|---|---|---|---|
| 2021/0159250 A1 | 5/2021 | Chang et al. | |
| 2021/0320130 A1* | 10/2021 | Xian | H01L 27/124 |
| 2023/0152643 A1* | 5/2023 | Yu | H01L 27/124 |
| | | | 349/33 |

* cited by examiner

LED DISPLAY DEVICE HAVING A BARRIER METAL LAYER AND METHOD OF FABRICATING THE SAME

CROSS-REFERENCE TO RELATED APPLICATION(S)

This application claims priority to and benefits of Korean patent application number 10-2021-0138780 under 35 U.S.C. § 119, filed on Oct. 18, 2021 in the Korean Intellectual Property Office, the entire contents of which are incorporated herein reference.

BACKGROUND

1. Technical Field

Various embodiments of the disclosure relate to a display device and a method of fabricating the display device.

2. Description of Related Art

With increased interest in information display and increased demand to use portable information media, demand for display devices increases, and commercialization thereof progresses.

SUMMARY

Various embodiments of the disclosure are directed to a display device capable of mitigating a deviation in alignment of light emitting elements, and a method of fabricating the display device.

A display device in accordance with an embodiment of the disclosure may include a conductive pattern disposed on a substrate, a passivation layer disposed on the conductive pattern, a first shielding electrode and a second shielding electrode that are disposed on the passivation layer and spaced apart from each other, a first electrode disposed on the first shielding electrode, a second electrode disposed on the second shielding electrode, and a light emitting element electrically connected between the first electrode and the second electrode. A first distance between the first shielding electrode and the second shielding electrode may be less than a second distance between the first electrode and the second electrode.

The first distance between the first shielding electrode and the second shielding electrode may be less than about one-third (⅓) of a length of the light emitting element.

The first distance between the first shielding electrode and the second shielding electrode may be about 1 μm.

The second distance between the first electrode and the second electrode may be greater than about three-fourths (¾) of the length of the light emitting element.

The second distance between the first electrode and the second electrode may be about 3.5 μm.

A thickness of the first shielding electrode may range from about 500 Å to about 1000 Å.

An electrical conductivity of each of the first and the second shielding electrodes may be less than an electrical conductivity of each of the first and the second electrodes.

The first and the second shielding electrodes may include titanium, and the first and the second electrodes may include aluminum.

The first electrode may contact the first shielding electrode. The second electrode may contact the second shielding electrode.

The display device may further include bank patterns disposed between the first electrode and the first shielding electrode and between the second electrode and the second shielding electrode. In a plan view, the light emitting element may be disposed between the bank patterns.

The conductive pattern may include a power line. The second electrode may pass through the second shielding electrode and contact the power line.

In a plan view, a distance between a side of the second shielding electrode and a corresponding side of the second electrode may be constant in an extension direction of the second electrode.

A method of fabricating a display device in accordance with an embodiment of the disclosure may include preparing a panel including a conductive pattern disposed on a substrate and a passivation layer disposed on the conductive pattern, forming a shielding electrode layer on the passivation layer, forming an electrode layer on the shielding electrode layer, simultaneously primary-etching the electrode layer and the shielding electrode layer using a mask to form a first electrode and a second electrode from the electrode layer, and to form a first shielding electrode and a second shielding electrode from the shielding electrode layer, secondary-etching the first electrode and the second electrode using the mask, stripping the mask, and aligning a light emitting element to be electrically connected between the first electrode and the second electrode.

After the secondary-etching, a second distance between the first electrode and the second electrode may be greater than a first distance between the first shielding electrode and the second shielding electrode.

The first distance between the first shielding electrode and the second shielding electrode may be less than about one-third (⅓) of a length of the light emitting element.

The second distance between the first electrode and the second electrode may be greater than about three-fourths (¾) of the length of the light emitting element.

The primary-etching may be performed through a dry etching process. The secondary-etching may be performed through a wet etching process. The electrode layer may have a high selectivity for the wet etching process, compared to a selectivity of the shielding electrode layer.

The electrode layer may include aluminum. The shielding electrode layer may include titanium.

The method may further include forming, before forming the electrode layer, a contact hole passing through the shielding electrode layer and the passivation layer so that the conductive pattern is exposed.

The electrode layer may contact the conductive pattern through the contact hole.

The method may further include forming patterns spaced apart from each other on the shielding electrode layer. The electrode layer may cover the patterns.

DETAILED DESCRIPTION OF THE EMBODIMENTS

Figure 1:
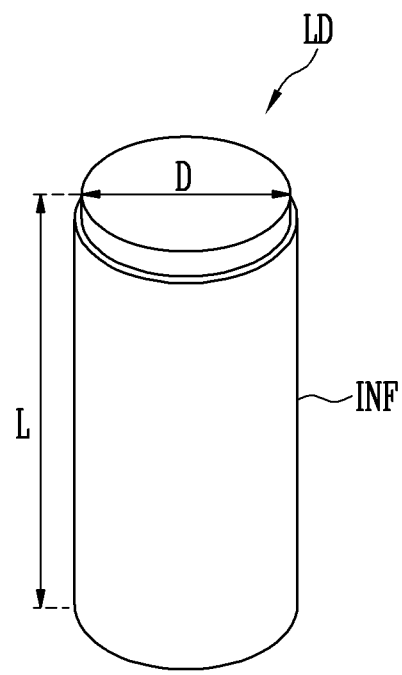
FIGS. 1 and 2 are a schematic perspective view and a schematic sectional view illustrating a light emitting element in accordance with an embodiment of the disclosure.

As the disclosure allows for various changes and numerous embodiments, particular embodiments will be illustrated in the drawings and described in detail in the written description. However, this is not intended to limit the disclosure to particular modes of practice, and it is to be appreciated that all changes, equivalents, and substitutes that do not depart from the spirit and technical scope of the disclosure are encompassed in the disclosure.

It will be understood that, although the terms "first", "second", etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element. In the disclosure, the singular forms are intended to include the plural forms as well, unless the context clearly indicates otherwise.

It will be further understood that the terms "comprise", "include", "have", etc. when used in this specification, specify the presence of stated features, integers, steps, operations, elements, components, and/or combinations thereof but do not preclude the presence or addition of one or more other features, integers, steps, operations, elements, components, and/or combinations thereof. Furthermore, in case that a first part such as a layer, a film, a region, or a plate is disposed on a second part, the first part may be not only directly on the second part but a third part may intervene between them. When it is expressed that a first part such as a layer, a film, a region, or a plate is formed on a second part, the surface of the second part on which the first part is formed is not limited to an upper surface of the second part but may include other surfaces such as a side surface or a lower surface of the second part. To the contrary, in case that a first part such as a layer, a film, a region, or a plate is under a second part, the first part may be not only directly under the second part but a third part may intervene between them.

Advantages and features of the disclosure, and methods for achieving the same will be clear with reference to embodiments described later in detail together with the accompanying drawings. However, it is to be noted that the disclosure is not limited to the embodiments but can be embodied in various other ways. In this specification, "connected/coupled" refers to one component not only directly coupling another component but also indirectly coupling another component through an intermediate component. Further, a connection may refer to a physical and/or electrical connection.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as "not overlapping" or to "not overlap" another element, this may include that the elements are spaced apart from each other, offset from each other, or set aside from each other or any other suitable term as would be appreciated and understood by those of ordinary skill in the art.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
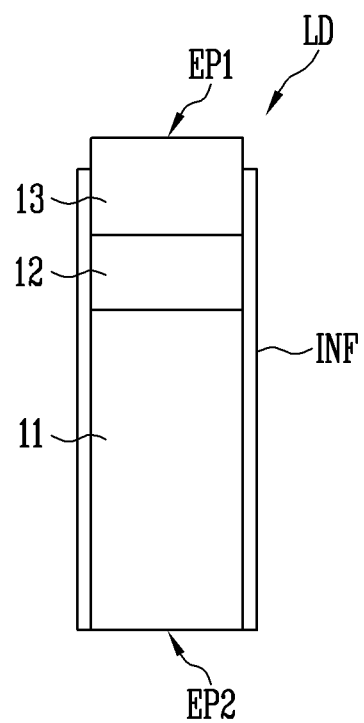

FIGS. 1 and 2 are a schematic perspective view and a schematic sectional view illustrating a light emitting element in accordance with an embodiment of the disclosure. Although FIGS. 1 and 2 illustrate a column-type light emitting element LD, the type and/or shape of the light emitting element LD is not limited thereto.

Referring to FIGS. 1 and 2, the light emitting element LD may include a first semiconductor layer 11, a second semiconductor layer 13, and an active layer 12 interposed between the first and second semiconductor layers 11 and 13. For example, if a direction in which the light emitting element LD extends refers to a longitudinal direction (L), the light emitting element LD may include the first semiconductor layer 11, the active layer 12, and the second semiconductor layer 13 which may be successively stacked on each other in the longitudinal direction (L).

The light emitting element LD may be provided in the form of a column extending in a direction. The light emitting element LD may include a first end EP1 and a second end EP2. One of the first and second semiconductor layers 11 and 13 may be disposed on the first end EP1 of the light emitting element LD. Another of the first and second semiconductor layers 11 and 13 may be disposed on the second end EP2 of the light emitting element LD.

In an embodiment, the light emitting element LD may be a light emitting element manufactured in a column shape through an etching method or the like. In this specification, the term "column-type" embraces a rod-like shape and a bar-like shape such as a cylindrical shape and a prismatic shape extending in a longitudinal direction (e.g., to have an aspect ratio greater than 1), and the cross-sectional shape thereof is not limited to a particular shape. For example, the length L of the light emitting element LD may be greater than a diameter D thereof (or a width of the cross-section thereof).

The light emitting element LD may have a small size corresponding to a range from the nanometer scale to the micrometer scale. For example, each light emitting element LD may have a diameter D (or a width) and/or a length L ranging from the nanometer scale to the micrometer scale. However, the size of the light emitting element LD is not limited thereto, and the size of the light emitting element LD may be changed in various ways depending on design conditions of various devices, e.g., a display device, using a light emitting device with the light emitting element LD as a light source.

The first semiconductor layer 11 may be a first conductive semiconductor layer. For example, the first semiconductor layer 11 may include an n-type semiconductor layer. For instance, the first semiconductor layer 11 may include an n-type semiconductor layer which includes at least one semiconductor material of InAlGaN, GaN, AlGaN, InGaN, AlN, and InN and is doped with a first conductive dopant such as Si, Ge, or Sn. However, the material for forming the first semiconductor layer 11 is not limited thereto, and the first semiconductor layer 11 may be formed of various other materials.

The active layer 12 may be disposed on the first semiconductor layer 11 and have a single-quantum well structure or a multi-quantum well structure. The location of the active layer 12 may be changed in various ways depending on the type of the light emitting element LD.

A cladding layer (not shown) doped with a conductive dopant may be formed on and/or under the active layer 12. For example, the cladding layer may be formed of ALGaN or InALGaN. In an embodiment, a material such as AlGaN or InAlGaN may be used to form the active layer 12, and various other materials may be used to form the active layer 12.

The second semiconductor layer 13 may be disposed on the active layer 12 and include a semiconductor layer having a type different from that of the first semiconductor layer 11. For instance, the second semiconductor layer 13 may include a p-type semiconductor layer which includes at least one semiconductor material of InAlGaN, GaN, AlGaN, InGaN, AlN, and InN, and is doped with a second conductive dopant such as Mg. However, the material for forming the second semiconductor layer 13 is not limited thereto, and the second semiconductor layer 13 may be formed of various other materials.

If a voltage equal to or greater than a threshold voltage is applied between the opposite ends of the light emitting element LD, the light emitting element LD may emit light by coupling of electron-hole pairs in the active layer 12. Since light emission of the light emitting element LD can be controlled based on the foregoing principle, the light emitting element LD may be used as a light source of various light emitting devices as well as a pixel of the display device.

The light emitting element LD may further include an insulating film INF provided on a surface of the light emitting element LD. The insulating film INF may be formed on the surface of the light emitting element LD to enclose an outer circumferential surface of at least the active layer 12, and may further enclose an area of each of the first and second semiconductor layers 11 and 13.

In an embodiment, the insulating film INF may allow the opposite ends of the light emitting element LD that have different polarities to be exposed to the outside. For example, the insulating film INF may allow one end of each of the first and second semiconductor layers 11 and 13 disposed on the first and second ends EP1 and EP2 of the light emitting element LD to be exposed. In an embodiment, the insulating film INF may allow a side portion of each of the first and second semiconductor layers 11 and 13 adjacent to the first and second ends EP1 and EP2 of the light emitting element LD having different polarities to be exposed.

In an embodiment, the insulating film INF may have a single-layer structure or a multi-layer structure (e.g., a double-layer structure formed of aluminum oxide ($AlO_x$) and silicon oxide ($SiO_x$)) including at least one insulating material among silicon oxide ($SiO_x$), silicon nitride ($SiN_x$), silicon oxynitride ($SiO_xN_y$), aluminum oxide ($AlO_x$), and titanium oxide ($TiO_x$). However, the disclosure is not limited thereto. In an embodiment, the insulating film INF may be omitted.

In case that the insulating film INF is provided to cover the surface of the light emitting element LD, particularly, an outer circumferential surface of the active layer 12, the active layer 12 may be prevented from short-circuiting with a first pixel electrode or a second pixel electrode to be described below. Consequently, the electrical stability of the light emitting element LD may be secured.

If the insulating film INF is provided on the surface of the light emitting element LD, occurrence of a defect on the surface of the light emitting element LD may be minimized, whereby the lifetime and efficiency of the light emitting element LD may be improved. Even in the case where light emitting elements LD are disposed adjacent to each other, an undesired short-circuit may be prevented from occurring between the light emitting elements LD.

In an embodiment, the light emitting element LD may further include an additional component as well as the first semiconductor layer 11, the active layer 12, the second semiconductor layer 13, and/or the insulating film INF that encloses the first semiconductor layer 11, the active layer 12, the second semiconductor layer 13. For example, the light emitting element LD may further include at least one fluorescent layer, at least one active layer, at least one semiconductor layer and/or at least one electrode layer disposed on an end of the first semiconductor layer 11, the active layer 12, and/or the second semiconductor layer 13. For example, a contact electrode layer may be disposed on each of the first and second ends EP1 and EP2 of the light emitting element LD. Although FIGS. 1 and 2 illustrate a column-type light emitting element LD, the type, the structure, and/or the shape of the light emitting element LD may be changed in various ways. For example, the light emitting element LD may be formed of a core-shell structure having a polypyramid shape.

A light emitting device including the light emitting element LD described above may be used not only in a display device but also in various devices which requires a light source. For instance, light emitting elements LD may be disposed in each pixel of a display panel, so that the light emitting elements LD may be used as a light source of the pixel. However, the application field of the light emitting element LD is not limited to the foregoing examples. For example, the light emitting element LD may also be used in other types of devices such as a lighting device, which requires a light source.

Figure 3:
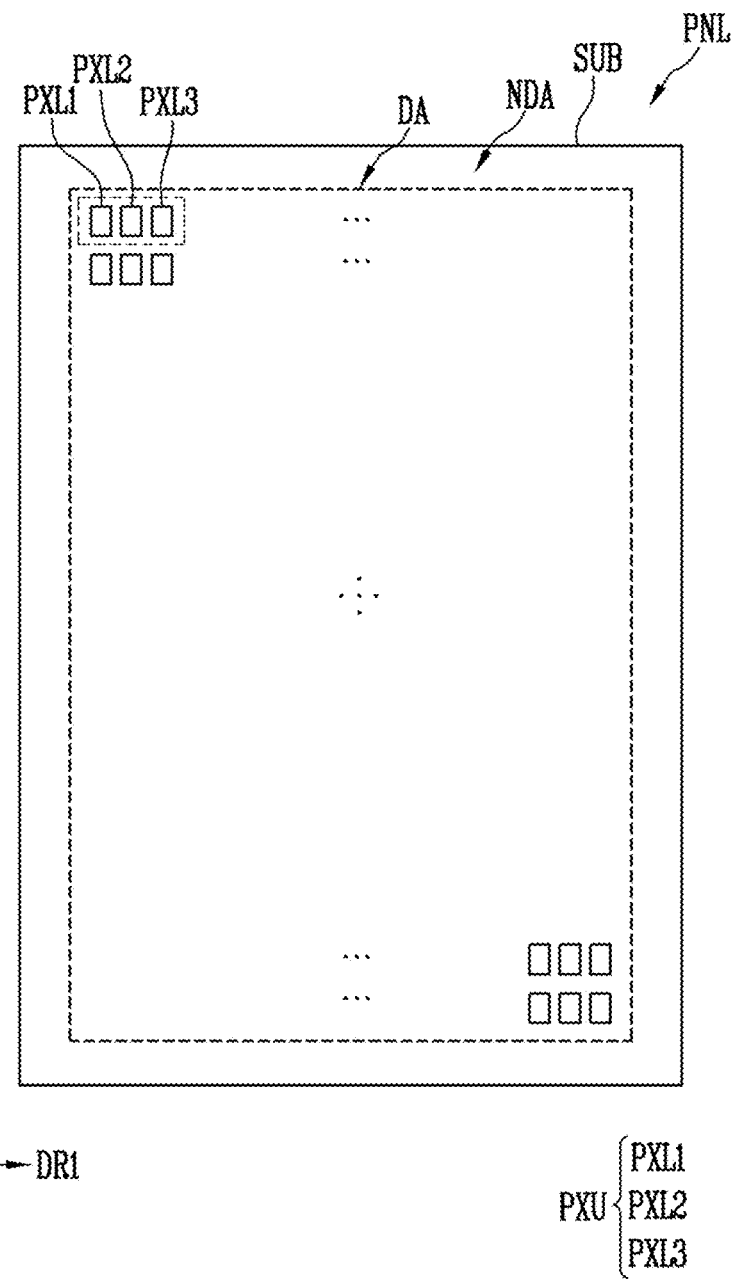
FIG. 3 is a schematic plan view illustrating a display device in accordance with an embodiment of the disclosure.

FIG. 3 is a schematic plan view illustrating a display device in accordance with an embodiment of the disclosure. FIG. 3 illustrates a display device, particularly, a display panel PNL provided in the display device, as an example of an electronic device which may use, as a light source, the light emitting element LD described in the embodiments of FIGS. 1 and 2.

Each pixel unit PXU of the display panel PNL and each pixel for forming the pixel unit PXU may include at least one light emitting element LD. For the sake of explanation, FIG. 3 simply illustrates the structure of the display panel PNL in accordance with an embodiment, focused on a display area DA. In some embodiments, although not illustrated, at least one driving circuit (e.g., at least one of a scan driver and a data driver), lines, and/or pads may be further provided on the display panel PNL.

Referring to FIG. 3, the display panel PNL may include a substrate SUB, and a pixel unit PXU disposed on the substrate SUB. The pixel unit PXU may include first pixels PXL1, second pixels PXL2, and/or third pixels PXL3. In the following embodiments, the term "pixel PXL (refer to FIG. 4)" or "pixels PXL" will be used to arbitrarily designate at least one pixel among the first pixels PXL1, the second pixels PXL2, and the third pixels PXL3, or collectively designate two or more kinds of pixels thereamong.

The substrate SUB may form a base of the display panel PNL and be a rigid or flexible substrate or film. For example, the substrate SUB may be a rigid substrate made of glass or reinforced glass, a flexible substrate (or a thin film) formed of plastic or metal, or at least one insulating layer. The material and/or properties of the substrate SUB is not particularly limited.

In an embodiment, the substrate SUB may be substantially transparent. Here, the words "substantially transparent" may mean that light can pass through the substrate SUB at a transmissivity or more. In an embodiment, the substrate SUB may be translucent or opaque. Furthermore, the substrate SUB may include reflective material in some embodiments.

The display panel PNL and the substrate SUB for forming the display panel PNL may include a display area DA for displaying an image, and a non-display area NDA formed in an area other than the display area DA.

The pixels PXL may be disposed in the display area DA. Various lines, pads, and/or internal circuits which may be connected to the pixels PXL of the display area DA may be disposed in the non-display area NDA. The pixels PXL may be regularly arranged according to a stripe or PenTile® arrangement structure. The arrangement structure of the pixels PXL is not limited thereto, and the pixels PXL may be arranged in the display area DA in various structures and/or schemes.

In an embodiment, two or more kinds of pixels PXL which emit different colors of light may be disposed in the display area DA. For example, first pixels PXL1 that emit a first color of light, second pixels PXL2 that emit a second color of light, and third pixels PXL3 that emit a third color of light may be arranged in the display area DA. At least one first pixel PXL1, at least one second pixel PXL2, and at least one third pixel PXL3 that may be disposed adjacent to each other may form one pixel unit PXU which may emit light having various colors. For example, each of the first to third pixels PXL1, PXL2, and PXL3 may be a sub-pixel that emits a color of light. In an embodiment, the first pixel PXL1 may be a red pixel which emits red light, a second pixel PXL2 may be a green pixel which emits green light, and a third pixel PXL3 may be a blue pixel which emits blue light. However, the disclosure is not limited thereto.

In an embodiment, the first pixel PXL1, the second pixel PXL2, and the third pixel PXL3 may include, as light sources, a light emitting element related to the first color, a light emitting element related to the second color, and a light emitting element related to the third color, so that the pixels PXL may respectively emit the first color of light, the second color of light, and the third color of light. In an embodiment, the first pixel PXL1, the second pixel PXL2, and the third pixel PXL3 may respectively include light emitting elements that emit the same color of light, and color filters and color conversion layers having different colors may be disposed on the respective light emitting elements so that the pixels PXL may respectively emit the first color of light, the second color of light, and the third color of light. However, the colors, the types, and/or the number of pixels PXL that form each pixel unit PXU are not particularly limited. In other words, the color of light to be emitted from each pixel PXL may be changed in various ways.

The pixel PXL may include at least one light source which may be driven by a control signal (e.g., a scan signal and a data signal) and/or a power supply (e.g., a first power supply and a second power supply). In an embodiment, the light source may include at least one light emitting element LD in accordance with any one of the embodiments of FIGS. 1 and 2, e.g., subminiature column-type light emitting elements LD having a small size corresponding to a range from the nanometer scale to the micrometer scale. However, the disclosure is not limited thereto, and different types of light emitting elements LD may be used as a light source of the pixel PXL.

In an embodiment, each pixel PXL may be formed of an active pixel. However, the types, structures, and/or driving schemes of the pixels PXL capable of being applied to the display device are not particularly limited. For example, each pixel PXL may have the same structure as that of a pixel for passive or active light emitting display devices which have various structures and/or may be operated in various driving schemes.

Figure 4:
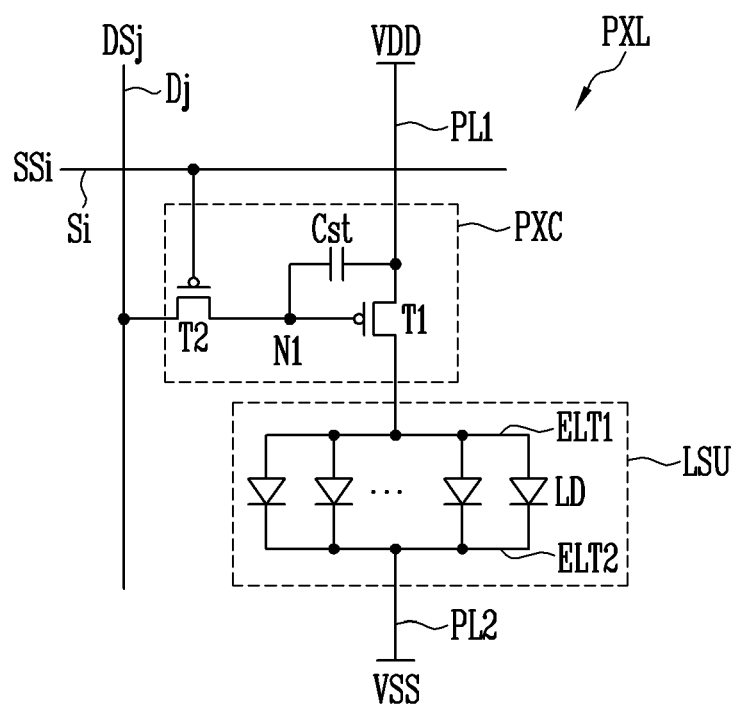
FIGS. 4 to 6 are schematic circuit diagrams each illustrating an embodiment of a pixel included in the display device of FIG. 3.
Figure 5:
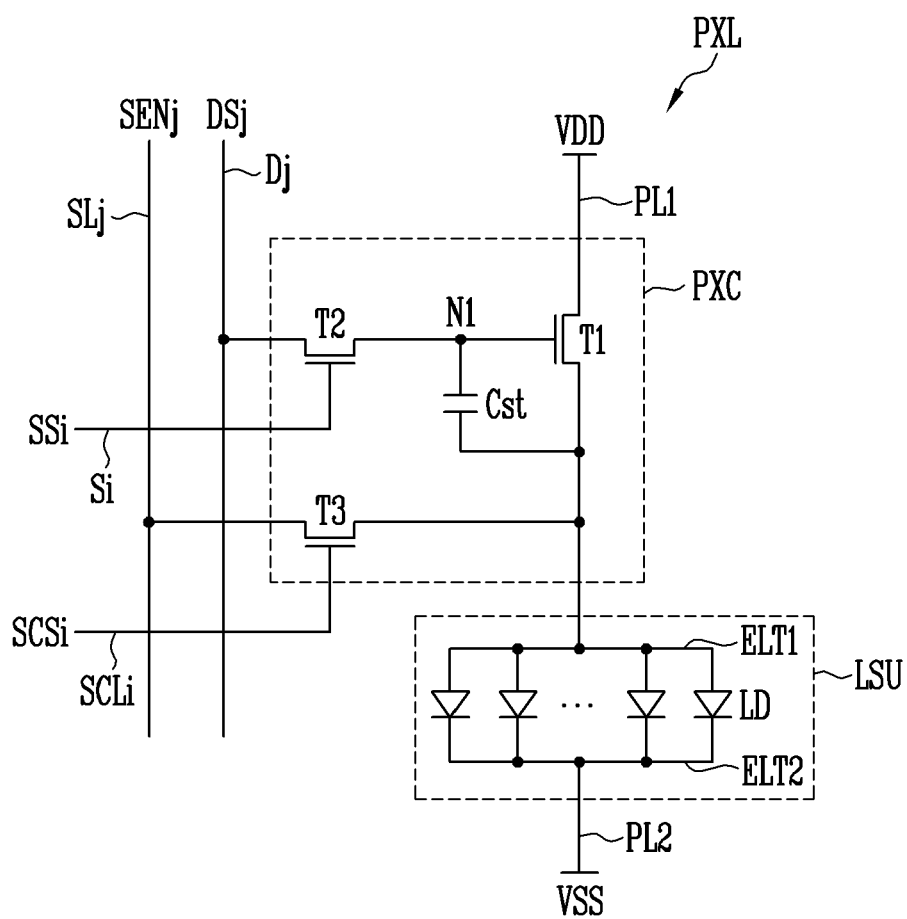
Figure 6:
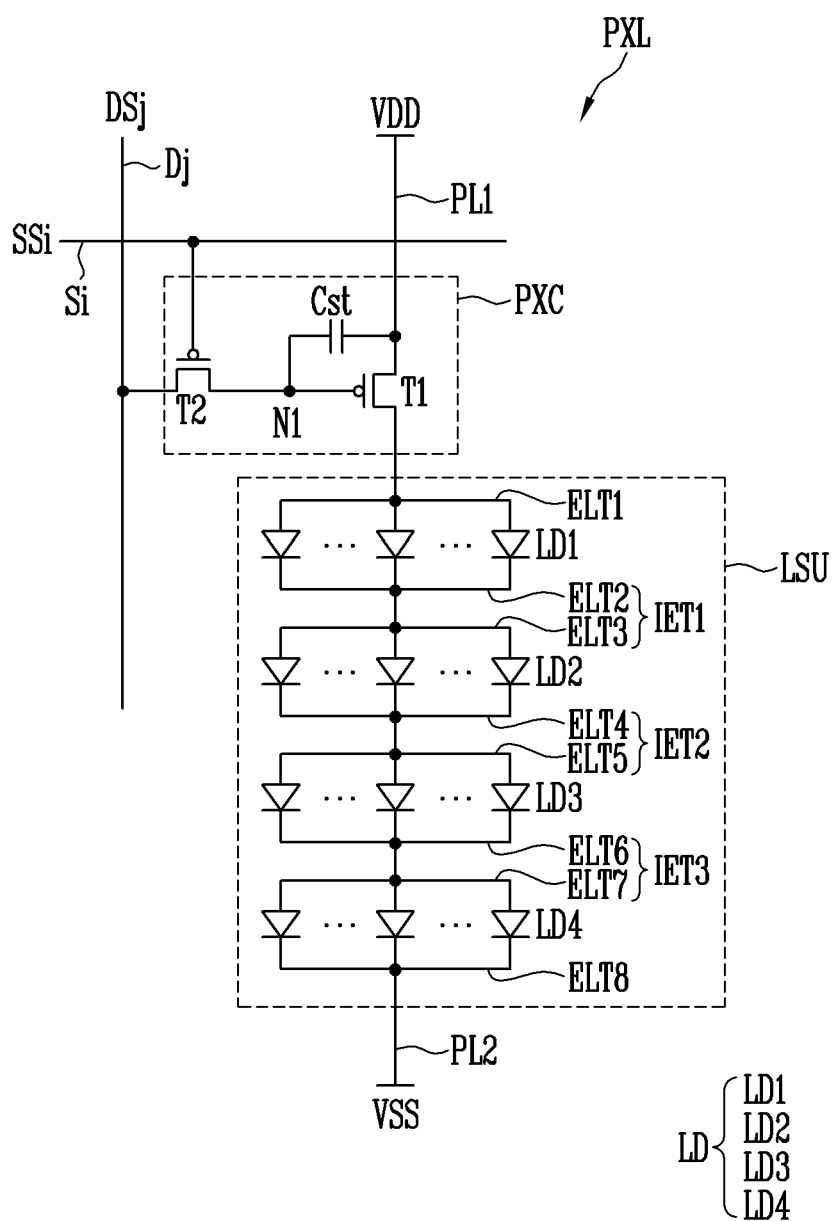

FIGS. 4 to 6 are schematic circuit diagrams each illustrating an embodiment of a pixel included in the display device of FIG. 3. For example, FIGS. 4 to 6 illustrate an embodiment of the pixel PXL which can be applied to an active display device. However, the types of the pixel PXL and the display device are not limited thereto.

In an embodiment, the pixel PXL illustrated in FIGS. 4 to 6 may be any one of the first pixel PXL1, the second pixel PXL2, and the third pixel PXL3 which may be provided on the display panel PNL of FIG. 3. The first pixel PXL1, the second pixel PXL2, and the third pixel PXL3 may have a substantially identical or similar structure.

Referring to FIG. 4, the pixel PXL may include a light source unit LSU that generates light having a luminance corresponding to a data signal, and a pixel circuit PXC that drives the light source unit LSU.

The light source unit LSU may include at least one light emitting element LD connected between the first power supply VDD and the second power supply VSS. For example, the light source unit LSU may include a first electrode ELT1 (also referred to as "first pixel electrode" or "first alignment electrode") connected to the first power supply VDD via the pixel circuit PXC and a first power line PL1, a second electrode ELT2 (also referred to as "second pixel electrode" or "second alignment electrode") connected to the second power supply VSS through a second power line PL2, and light emitting elements LD connected in the same direction between the first and second electrodes ELT1 and ELT2. In an embodiment, the first electrode ELT1 may be an anode electrode, and the second electrode ELT2 may be a cathode electrode.

Each of the light emitting elements LD may include a first end (e.g., a p-type end) electrically connected to the first power supply VDD by the first electrode ELT1 and/or the pixel circuit PXC, and a second end (e.g., an n-type end) electrically connected to the second power supply VSS by the second electrode ELT2. In other words, the light emitting elements LD may be connected in parallel between the first and second electrodes ELT1 and ELT2 in a forward direction. Each of the light emitting elements LD connected in the forward direction between the first power supply VDD and the second power supply VSS may form a valid light source. Such valid light sources may form the light source unit LSU of the pixel PXL.

The first power supply VDD and the second power supply VSS may have different potentials to allow the light emitting elements LD to emit light. For example, the first power supply VDD may be set as a high-potential power supply, and the second power supply VSS may be set as a low-potential power supply. Here, a difference in potential between the first power supply VDD and the second power supply VSS may be set to a threshold voltage of the light emitting elements LD or more during at least an emission period of the pixel PXL.

The first ends (e.g., p-type ends) of the light emitting elements LD that form each light source unit LSU may be connected in common to the pixel circuit PXC by an electrode of the light source unit LSU (e.g., the first electrode ELT1 of each pixel PXL), and be connected to the first power supply VDD by the pixel circuit PXC and the first power line PL1. The second ends (e.g., n-type ends) of the light emitting elements LD may be connected in common to the second power supply VSS by the second power line PL2 and another electrode of the light source unit LSU (e.g., the second electrode ELT2 of each pixel PXL).

The light emitting elements LD may emit light having a luminance corresponding to driving current supplied thereto through the corresponding pixel circuit PXC. For example, during each frame period, the pixel circuit PXC may supply driving current corresponding to a gray scale value to be expressed in the corresponding frame to the light source unit LSU. The driving current supplied to the light source unit LSU may be divided into parts that flow to the light emitting elements LD connected in the forward direction. Hence, each of the light emitting elements LD may emit light having a luminance corresponding to current applied thereto, so that the light source unit LSU may emit light having a luminance corresponding to the driving current.

The pixel circuit PXC may be electrically connected between the first power supply VDD and the first electrode ELT1. The pixel circuit PXC may be electrically connected to a scan line Si and a data line Dj of the corresponding pixel PXL. For example, if the pixel PXL is disposed on an i-th (i is a natural number) horizontal line (row) and a j-th (j is a natural number) vertical line (column) of the display area DA, the pixel circuit PXC of the pixel PXL may be electrically connected to an i-th scan line Si and a j-th data line Dj of the display area DA.

In an embodiment, the pixel circuit PXC may include transistors and at least one capacitor. For example, the pixel circuit PXC may include a first transistor T1, a second transistor T2, and a storage capacitor Cst.

The first transistor T1 may be electrically connected between the first power supply VDD and the light source unit LSU. For example, a first electrode (e.g., a source electrode) of the first transistor T1 may be electrically connected to the first power supply VDD, and a second electrode (e.g., a drain electrode) of the first transistor T1 may be electrically connected to the first electrode ELT1. A gate electrode of the first transistor T1 may be electrically connected to a first node N1. The first transistor T1 may control driving current to be supplied to the light source unit LSU in response to the voltage of the first node N1. In other words, the first transistor T1 may be a driving transistor that controls the driving current of the pixel PXL.

The second transistor T2 may be electrically connected between the data line Dj and the first node N1. For example, a first electrode (e.g., a source electrode) of the second transistor T2 may be electrically connected to the data line Dj, and a second electrode (e.g., a drain electrode) of the second transistor T2 may be electrically connected to the first node N1. A gate electrode of the second transistor T2 may be electrically connected to the scan line Si. In case that a scan signal SSi having a gate-on voltage (e.g., a low level voltage) is supplied from the scan line Si, the second transistor T2 may be turned on to electrically connect the first node N1 to the data line Dj.

During each frame period, a data signal DSj of a corresponding frame may be supplied to the data line Dj, and the data signal DSj is transmitted to the first node N1 through the second transistor T2 that may be turned on during a period in which the scan signal SSi having the gate-on voltage is supplied. In other words, the second transistor T2 may be a switching transistor that transmits each data signal DSj to the interior of the pixel PXL.

An electrode of the storage capacitor Cst may be electrically connected to the first power supply VDD, and another electrode thereof may be electrically connected to the first node N1. The storage capacitor Cst may be charged with a voltage corresponding to a data signal DSj to be supplied to the first node N1 during each frame period.

Although FIG. 4 illustrates that the transistors included in the pixel circuit PXC, e.g., both the first and second transistors T1 and T2, may be p-type transistors, the disclosure is not limited thereto. At least one of the first and second transistors T1 and T2 may be changed to an n-type transistor. The pixel circuit PXC may be formed of a pixel circuit which may have various structures and/or be operated by various driving schemes.

Referring to FIG. 5, the pixel circuit PXC may be further connected to a sensing control line SCLi and a sensing line SLj For example, the pixel circuit PXC of the pixel PXL disposed on the i-th horizontal line and the j-th vertical line of the display area DA may be electrically connected to an i-th sensing control line SCLi and a j-th sensing line SLj of the display area DA. The pixel circuit PXC may further include a third transistor T3. In an embodiment, the sensing line SLj may be omitted, and characteristics of the pixel PXL may be detected by detecting a sensing signal SENj through the data line Dj of the corresponding pixel PXL (or an adjacent pixel).

The third transistor T3 may be electrically connected between the first transistor T1 and the sensing line SLj. For example, a first electrode of the third transistor T3 may be electrically connected to one electrode (e.g., a source electrode) of the first transistor T1 connected to the first electrode ELT1, and a second electrode of the third transistor T3 may be electrically connected to the sensing line SLj. In case that the sensing line SLj is omitted, the second electrode of the third transistor T3 may be electrically connected to the data line Dj.

A gate electrode of the third transistor T3 may be connected to the sensing control line SCLi. In case that the sensing control line SCLi is omitted, the gate electrode of the third transistor T3 may be connected to the scan line Si. The third transistor T3 may be turned on by a sensing control signal SCSi having a gate-on voltage (e.g., a high level voltage) supplied to the sensing control line SCLi during a sensing period, and thus electrically connect the sensing line SLj with the first transistor T1.

In an embodiment, the sensing period may be a period in which characteristics of each of the pixels PXL disposed in the display area DA (e.g., a threshold voltage, etc. of the first transistor T1) may be extracted. During the sensing period, the first transistor T1 may be turned on by supplying a reference voltage capable of turning on the first transistor T1 to the first node N1 through the data line Dj and the second transistor T2, or connecting each pixel PXL to a current source or the like. Furthermore, the third transistor T3 may be turned on by supplying a sensing control signal SCSi having a gate-on voltage to the third transistor T3, so that the first transistor T1 can be electrically connected to the sensing line SLj. Thereafter, a sensing signal SENj may be obtained through the sensing line SLj, and characteristics of each pixel PXL including the threshold voltage, etc. of the first transistor T1 may be detected using the sensing signal SENj. Information about the characteristics of each pixel PXL may be used to convert image data such that a deviation in characteristic between pixels PXL disposed in the display area DA can be compensated for.

Although FIG. 5 illustrates an embodiment where all of the first, second, and third transistors T1, T2, and T3 may be n-type transistors, the disclosure is not limited thereto. For example, at least one of the first, second, and third transistors T1, T2, and T3 may be changed to a p-type transistor.

Furthermore, although FIGS. 4 and 5 illustrate an embodiment in which valid light sources, e.g., light emitting elements LD, for forming each light source unit LSU may be connected in parallel to each other, the disclosure is not limited thereto. For example, as illustrated in FIG. 6, the light source unit LSU of each pixel PXL may have a serial structure. In the description of embodiments of FIG. 6, like reference numerals are used to designate components similar or equal to those of the embodiments of FIGS. 4 and 5 (e.g., the pixel circuit PXC), and detailed explanation thereof will be omitted.

Referring to FIG. 6, the light source unit LSU may include light emitting elements LD divided into at least four serial sets and connected in series/parallel to each other. Each serial set may include a pair of electrodes (e.g., two electrodes), and at least one light emitting element LD electrically connected between the pair of electrodes. Here, the numbers of light emitting elements LD that form the respective serial sets may be identical with or different from each other. The number of light emitting elements LD of each serial set is not particularly limited. For example, a first serial set may include a first electrode ELT1, a second electrode ELT2, and at least one first light emitting element LD1 electrically connected between the first and second electrodes ELT1 and ELT2. A second serial set may include a third electrode ELT3, a fourth electrode ELT4, and at least one second light emitting element LD2 electrically connected between the third and fourth electrodes ELT3 and ELT4. Likewise, a third serial set may include a fifth electrode ELT5, a sixth electrode ELT6, and at least one third light emitting element LD3 electrically connected between the fifth and sixth electrodes ELT5 and ELT6. A fourth serial set may include a seventh electrode ELT7, an eighth electrode ELT8, and at least one fourth light emitting element LD4 electrically connected between the seventh and eighth electrodes ELT7 and ELT8.

An initial electrode of the light source unit LSU, e.g., the first electrode ELT1, may be a first pixel electrode (or an anode electrode) of the light source unit LSU. A last electrode of the light source unit LSU, e.g., the eighth electrode ELT8, may be a second pixel electrode (or a cathode electrode) of the light source unit LSU.

Electrodes of the light source unit LSU, e.g., the second to seventh electrodes ELT2 to ELT7, may form respective intermediate electrodes. For example, the second electrode ELT2 and the third electrode ELT3 may be integrally or non-integrally connected to each other to form a first intermediate electrode IET1. Likewise, the fourth electrode ELT4 and the fifth electrode ELT5 may be integrally or non-integrally connected to each other to form a second intermediate electrode IET2. The sixth electrode ELT6 and the seventh electrode ELT7 may be integrally or non-integrally connected to each other to form a third intermediate electrode IET3. The second and third electrodes ELT2 and ELT3 may be integrated and regarded as the first intermediate electrode IET1. The fourth and fifth electrodes ELT4 and ELT5 may be integrated and regarded as the second intermediate electrode IET2. The sixth and seventh electrodes ELT6 and ELT7 may be integrated and regarded as the third intermediate electrode IET3.

On the assumption that the light source unit LSU is configured using the light emitting elements LD having the same conditions (e.g., the same size and/or number) as valid light sources, if the light emitting elements LD may be connected to each other in a serial or serial/parallel combination structure, the power efficiency can be enhanced. For example, in the light source unit LSU in which the light emitting elements LD may be connected in series or serial/parallel structure, the luminance to be expressed based on the same current may be higher than that of the case where the light emitting elements LD may be connected only in parallel to each other. Furthermore, in the light source unit LSU in which the light emitting elements LD may be connected in series or serial/parallel structure, driving current needed to express the same luminance may be reduced, compared to that of the case where the light emitting elements LD may be connected in parallel to each other. Furthermore, in the pixel PXL in which the light emitting elements LD may be connected in series or in a serial/parallel combination structure, even if a short-circuit defect or the like occurs in some serial sets, a certain degree of luminance can be expressed by the light emitting elements LD of other serial sets, so that the probability of occurrence of a black spot defect in the pixel PXL can be reduced.

Figure 7:
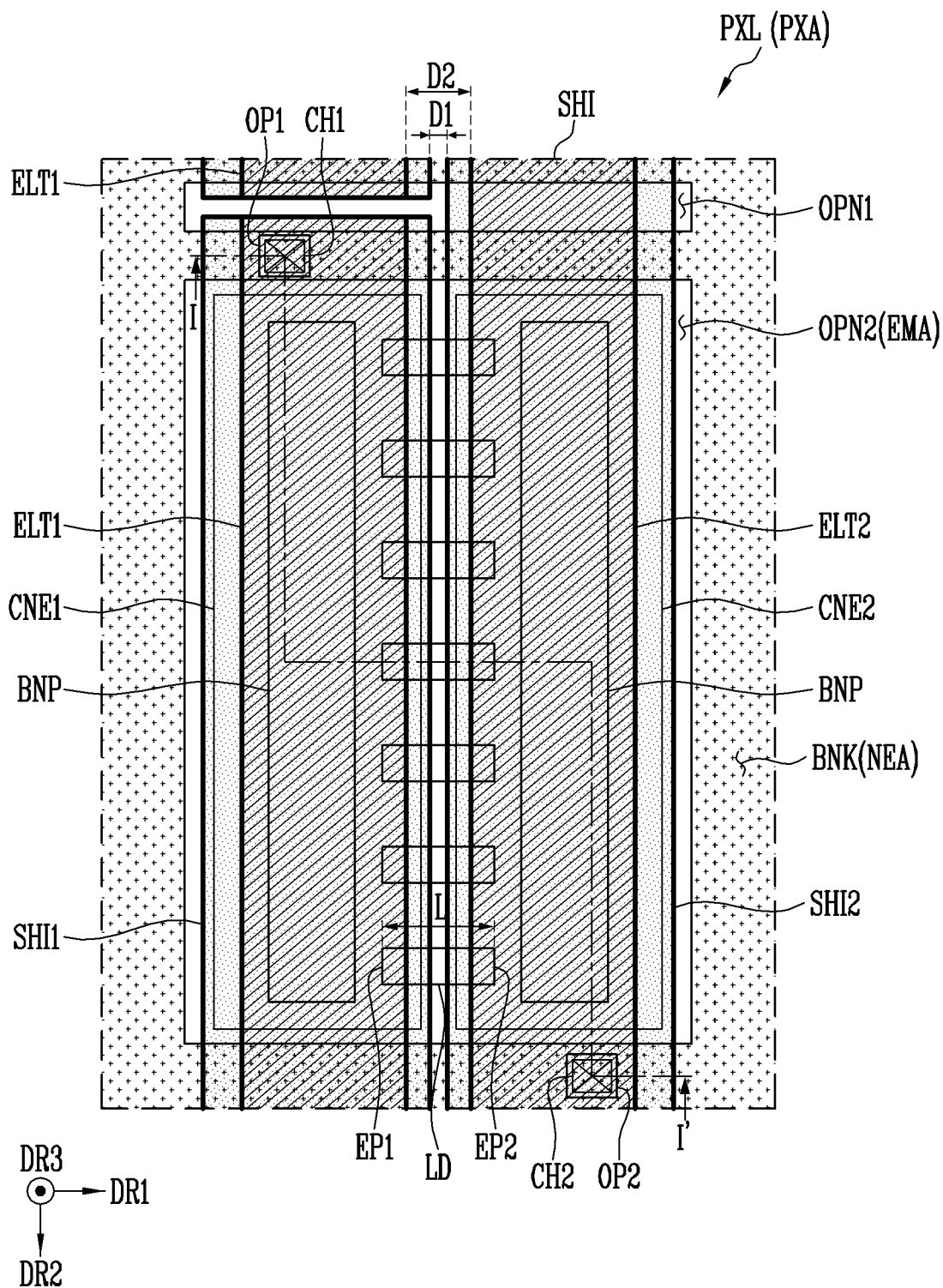
FIG. 7 is a schematic plan view illustrating an embodiment of the pixel of each of FIGS. 4 and 5.
Figure 8:
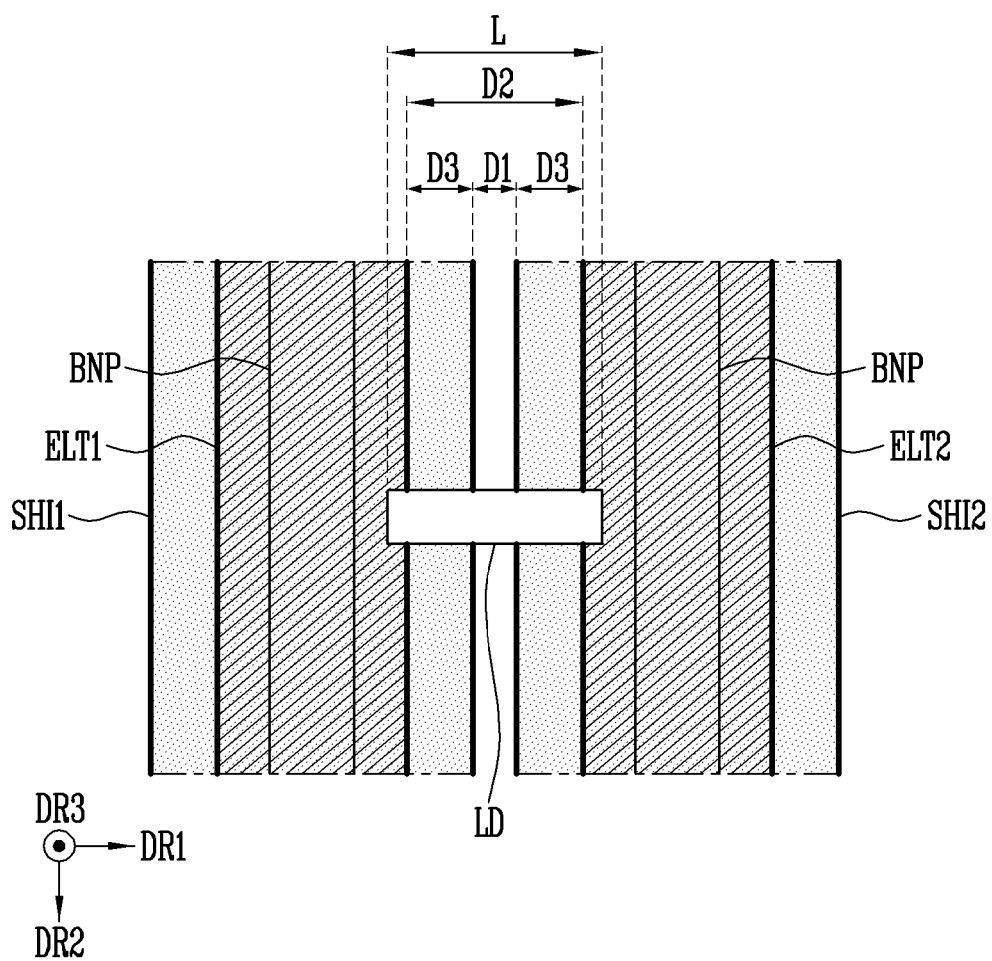
FIG. 8 is a schematic plan view illustrating an embodiment of the pixel of FIG. 7.

FIG. 7 is a schematic plan view illustrating an embodiment of the pixel of each of FIGS. 4 and 5. For the sake of explanation, in FIG. 7, some of the transistors electrically connected to the light emitting elements LD and some of the signal lines electrically connected to the transistors will be omitted. FIG. 8 is a schematic plan view illustrating an embodiment of the pixel of FIG. 7. FIG. 8 simply illustrates the first and second electrodes ELT1 and ELT2 and first and second shielding electrodes SHI1 and SHI2, based on one light emitting element LD.

Referring to FIGS. 3 to 5 and 7, each pixel PXL may be formed in a pixel area PXA provided in the display area DA of the substrate SUB. The pixel area PXA may include an emission area EMA, and a non-emission area NEA formed in an area other than the emission area EMA. The non-emission area NEA may be an area that encloses the emission area EMA.

Each pixel PXL may include a bank BNK, a bank pattern BNP (or a pattern), a first electrode ELT1, a second electrode ELT2, a first shielding electrode SHI1, a second shielding electrode SHI2, a first contact electrode CNE1, a second contact electrode CNE2, and a light emitting element LD.

The bank BNK may be disposed in the non-emission area NEA of the pixel area PXA. With regard to the pixel PXL illustrated in the drawing and pixels PXL adjacent thereto, the bank BNK may be a structure for defining (or partitioning) the pixel areas PXA and/or the emission areas EMA of the respect pixels PXL. In an embodiment, during a process of supplying light emitting elements LD to each pixel PXL, the bank BNK may be a pixel defining layer or a dam structure for defining an area to which the light emitting elements LD are to be supplied. For example, since the emission area EMA of each pixel PXL is defined by the bank BNK, a mixed solution (e.g., ink) including a target amount and/or type of light emitting elements LD may be supplied (or input) to the emission area EMA.

The bank BNK may include at least one opening which exposes components disposed under the bank BNK in the pixel area PXA. For example, the bank BNK may include a first opening OPN1 and a second opening OPN2 which exposes components disposed under the bank BNK. The first opening OPN1 of the bank BNK may be disposed adjacent to an upper side of the pixel area PXA. The second opening OPN2 of the bank BNK may correspond to the emission area EMA of the pixel PXL. The shown pixel PXL and an end of a first electrode ELT1 of a pixel PXL adjacent to the shown pixel PXL in a second direction DR2 may be disposed in the first opening OPN1. In the second opening OPN2, the bank pattern BNP, the light emitting elements LD, the first contact electrode CNE1, and the second contact electrode CNE2 may be disposed, and a portion of the first electrode ELT1 and a portion of the second electrode ELT2 may also be disposed.

The bank pattern BNP may be disposed in the emission area EMA. The bank pattern BNP may be a support which supports the first electrode ELT1 and the second electrode ELT2 to change surface profiles (or shapes) of the first electrode ELT1 and the second electrode ELT2 which will be described below, so that light emitted from the light emitting elements LD can be guided in an image display direction (e.g., in the third direction DR3) of the display device.

The first electrode ELT1 may extend in the second direction DR2. Here, the first electrode ELT1 of the shown pixel PXL may be separated from the first electrode ELT1 included in the pixel PXL adjacent thereto in the second direction DR2 in the first opening OPN1. In other words, after the light emitting elements LD may be supplied and aligned in the pixel area PXA, a separation process for the first electrodes ELT1 in the first opening OPN1 of the bank BNK may be performed.

The second electrode ELT2 may be spaced apart from the first electrode ELT1 in the first direction DR1. The second electrode ELT2 may extend in the second direction DR2. The second electrode ELT2 of the shown pixel PXL may extend from a second electrode ELT2 included in the pixel PXL adjacent thereto in the second direction DR2.

The first electrode ELT1 and the second electrode ELT2 may be used as alignment electrodes in such a way that alignment voltages may be applied thereto after a mixed solution (e.g., ink) including light emitting elements LD may be input to the emission area EMA. The first electrode ELT1 may be a first alignment electrode, and the second electrode ELT2 may be a second alignment electrode. Here, the light emitting elements LD may be aligned in a desired direction and/or at desired positions by an electric field formed between the first alignment electrode and the second alignment electrode. Furthermore, the first electrode ELT1 and the second electrode ELT2 may function as driving electrodes for driving the light emitting elements LD after the light emitting elements LD have been aligned.

The first electrode ELT1 may be an anode of the light source unit LSU described with reference to FIGS. 4 and 5. Hence, the first electrode ELT1 may be physically and/or electrically connected, through a first contact hole CH1, to the first transistor T1 described with reference to FIG. 4.

The second electrode ELT2 may be a cathode of the light source unit LSU described with reference to FIGS. 4 and 5. Hence, the second electrode ELT2 may be physically and/or electrically connected, through a second contact hole CH2, to the second power line PL2 (or the second power supply VSS) described with reference to FIGS. 4 and 5.

The first shielding electrode SHI1 may overlap the first electrode ELT1. In a plan view, the first shielding electrode SHI1 may cover the first electrode ELT1. For example, the first shielding electrode SHI1 may extend in the first direction DR1 compared to the first electrode ELT1, so that the first shielding electrode SHI1 can completely cover the first electrode ELT1, in a plan view.

The first shielding electrode SHI1 may extend in the second direction DR2. Here, the first shielding electrode SHI1 of the shown pixel PXL may be separated from the first shielding electrode SHI1 included in the pixel PXL adjacent thereto in the second direction DR2 in the first opening OPN1. In other words, after the light emitting elements LD may be supplied and aligned in the pixel area PXA, a separation process for the first shielding electrode SHI1 along with the first electrode ELT1 in the first opening OPN1 of the bank BNK may be performed.

The second shielding electrode SHI2 may be spaced apart from the first electrode ELT1 in the first direction DR1. Likewise with the first shielding electrode SHI1, the second shielding electrode SHI2 may overlap the second electrode ELT2. In a plan view, the second shielding electrode SHI2 may cover the second electrode ELT2.

The second shielding electrode SHI2 may extend in the second direction DR2. The second shielding electrode SHI2 of the shown pixel PXL may extend to the pixel PXL adjacent thereto in the second direction DR2.

As will be described with reference to FIG. 13, the first and second shielding electrodes SHI1 and SHI2 may block an electric field (or an electric field effect) which may occur between the first and second electrodes ELT1 and ELT2 and a conductor (or a conductive pattern, e.g., an electrode of a transistor, or a signal line) provided under the first and second shielding electrodes SHI1 and SHI2. Furthermore, the first and second shielding electrodes SHI1 and SHI2 may prevent light emitted from the light emitting element LD from traveling downward, and enhance light output efficiency of the pixel PXL in a third direction DR3 (e.g., light output efficiency in a frontal direction in which an image is displayed).

In a plan view, the first and second shielding electrodes SHI1 and SHI2 each may have a bar shape extending in the second direction DR2, but the disclosure is not limited thereto. The shapes of the first and second shielding electrodes SHI1 and SHI2 may be changed in various ways to correspond to the shapes of the first and second electrodes ELT1 and ELT2 that may be respectively disposed thereabove.

The first shielding electrode SHI1 may include a first contact opening OP1. The first contact opening OP1 may be an area enclosing the first contact hole CH1. The first electrode ELT1 may be physically and/or electrically connected to a first transistor electrode TE1 of the first transistor T1, which will be described below, through the first contact hole CH1 of the first contact opening OP1.

The second shielding electrode SHI2 may include a second contact opening OP2. The second contact opening OP2 may be an area enclosing the second contact hole CH2. The second electrode ELT2 may be physically and/or electrically connected to the second power line PL2, which will be described below, through the second contact hole CH2 of the second contact opening OP2.

In embodiments, the first shielding electrode SHI1 and the second shielding electrode SHI2 may be spaced apart from each other by a first distance D1. The first electrode ELT1 and the second electrode ELT2 may be spaced apart from each other by a second distance D2. The first distance D1 may be less than the second distance D2.

For example, as illustrated in FIG. 8, the first electrode ELT1 and the second electrode ELT2 may be spaced apart from each other by the second distance D2 in the first direction DR1. In an embodiment, the second distance D2 may be greater than about three-fourths (¾) of the length L of the light emitting element LD and be less than 1.5 times the length L of the light emitting element LD. For example, in case that the length L of the light emitting element LD ranges from 3 μm to 5 μm, the second distance D2 may be about 3.5 μm.

Figure 12:
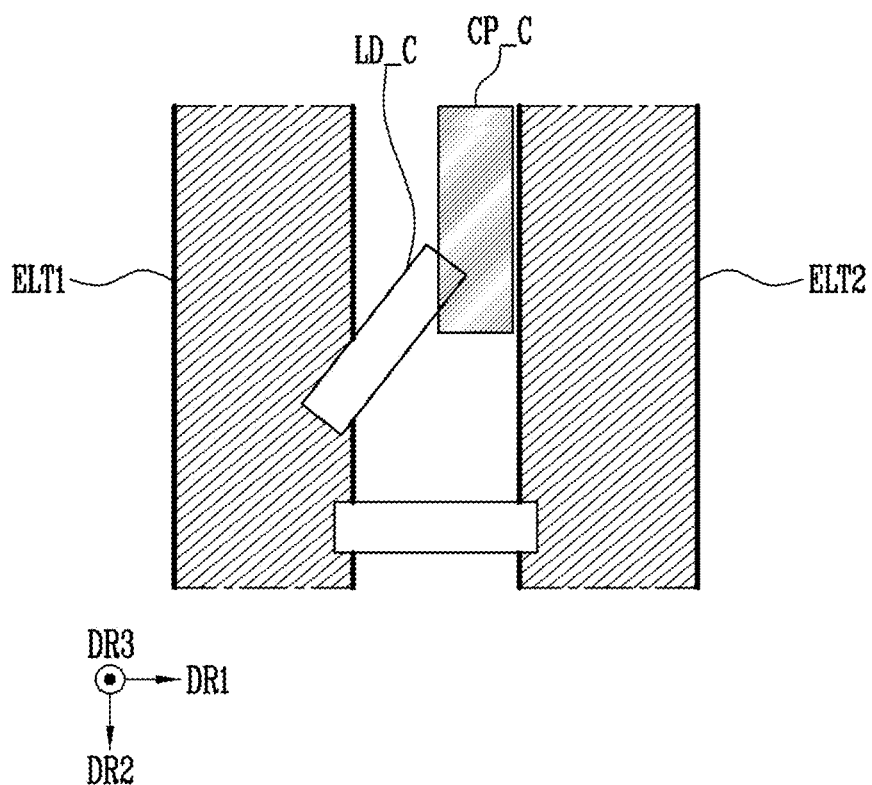

In case that the second distance D2 is relatively small, the light emitting element LD may be abnormally aligned, e.g., in a diagonal direction, as illustrated in FIG. 12, rather than being aligned such that the longitudinal direction (L) of the light emitting element LD is parallel to the first direction DR1. A defect (e.g., an open circuit or a short circuit) attributable to the misaligned light emitting element LD may be caused. Unlike this, in case that the second distance D2 is relatively large, the light emitting elements LD illustrated in FIG. 7 may not be uniformly arranged with respect to the second direction DR2, and a deviation in aligned positions of the light emitting elements LD with respect to the second direction DR2 may be caused. The light emitting element LD may not be connected to the first and second electrodes ELT1 and ELT2, so that the emission efficiency of the pixel PXL may be reduced.

For example, as illustrated in FIG. 8, the first shielding electrode SHI1 and the second shielding electrode SHI2 may be spaced apart from each other by the first distance D1 in the first direction DR1. In an embodiment, the first distance D1 may be less than about one-third (⅓) of the length L of the light emitting element LD. For example, the first distance D1 may be about 1 μm.

In an embodiment, in a plan view, a third distance D3 (or the shortest distance) between one side of the first shielding electrode SHI1 and one corresponding side of the first electrode ELT1 may be constant in a direction in which the first electrode ELT1 extends. For example, as illustrated in FIG. 8, the third distance D3 may be constant in the second direction DR2. The third distance D3 may be changed depending on the first distance D1 and the second distance D2. For example, the third distance D3 may range from about 1 μm to about 1.5 μm.

Likewise, in a plan view, a third distance D3 (or the shortest distance) between one side of the second shielding electrode SHI2 and one corresponding side of the second electrode ELT2 may be constant in a direction in which the second electrode ELT2 extends. For example, as illustrated in FIG. 8, the third distance D3 may be constant in the second direction DR2. As will be described with reference to FIGS. 17 to 19, the first and second electrodes ELT1 and ELT2 and the first and second shielding electrodes SHI1 and SHI2 may be formed using one mask, so that the distances between edges of the first and second electrodes ELT1 and ELT2 and edges of the first and second shielding electrodes SHI1 and SHI2 may be generally constant.

Referring again to FIG. 7, the first contact electrode CNE1 may be disposed to overlap the first end EP1 of each of the light emitting elements LD and the first electrode ELT1. Hence, the first contact electrode CNE1 may electrically and/or physically connect the first end EP1 of the light emitting element LD with the first electrode ELT1.

The second contact electrode CNE2 may be disposed to overlap the second end EP2 of each of the light emitting elements LD and the second electrode ELT2. Hence, the second contact electrode CNE2 may electrically and/or physically connect the second end EP2 of the light emitting element LD with the second electrode ELT2.

In a plan view, the first contact electrode CNE1 and the second contact electrode CNE2 each may have a bar shape extending in the second direction DR2, but the disclosure is not limited thereto. In an embodiment, the shape of each of the first contact electrode CNE1 and the second contact electrode CNE2 may be changed in various ways within a range in which the first and second contact electrodes CNE1 and CNE2 can be reliably electrically connected to each of the light emitting elements LD. The shape of each of the first contact electrode CNE1 and the second contact electrode CNE2 may be changed in various ways, taking into account connection relationship with the first electrode ELT1 and the second electrode ELT2 that may be disposed thereunder.

Each of the light emitting elements LD may be disposed between the first electrode ELT1 and the second electrode ELT2 such that the longitudinal direction (L) there of is parallel to the first direction DR1. In a plan view, the light emitting elements LD may be disposed between adjacent bank patterns BNP.

The first end EP1 (or an end) of the light emitting element LD may overlap the first electrode ELT1 and the first contact electrode CNE1. The first end EP1 of the light emitting element LD may be physically and/or electrically connected with the first electrode ELT1 and the first contact electrode CNE1.

The second end EP2 (or another end) of the light emitting element LD may overlap the second electrode ELT2 and the second contact electrode CNE2. The second end EP2 of the light emitting element LD may be physically and/or electrically connected with the second electrode ELT2 and the second contact electrode CNE2.

As described above, the first and second shielding electrodes SHI1 and SHI2 may respectively cover the first and second electrodes ELT1 and ELT2, in a plan view, and block an electric field (or an electric field effect) which may occur between the first and second electrodes ELT1 and ELT2 and conductors (or conductive patterns) provided under the first and second shielding electrodes SHI1 and SHI2. Therefore, the light emitting element LD may be prevented from being misaligned by the electric field caused by the conductors, so that a defect resulting from the misaligned light emitting element LD may be prevented from occurring.

Figure 9:
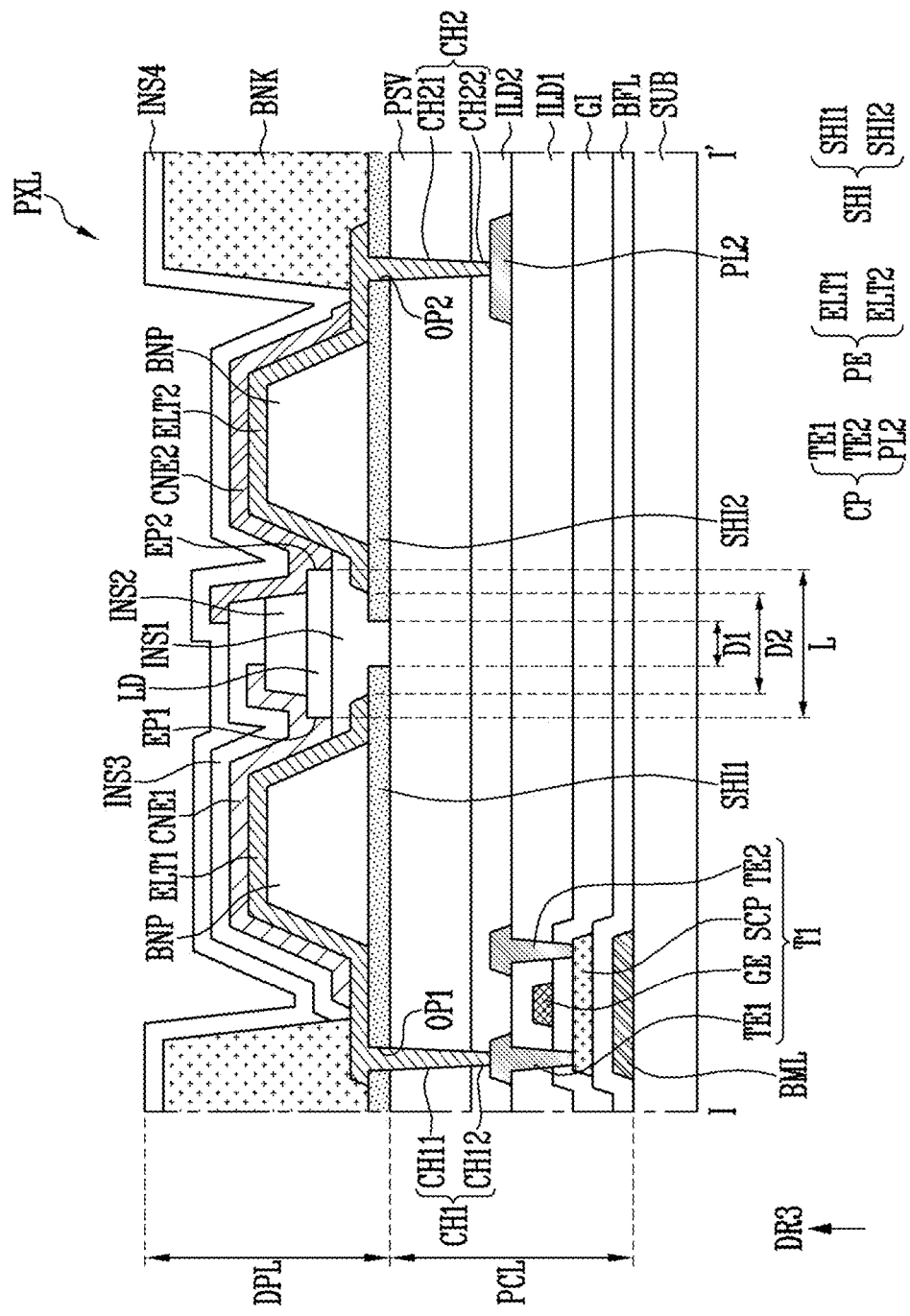
FIGS. 9 and 10 are schematic sectional views taken along line I-I' of FIG. 7.
Figure 10:
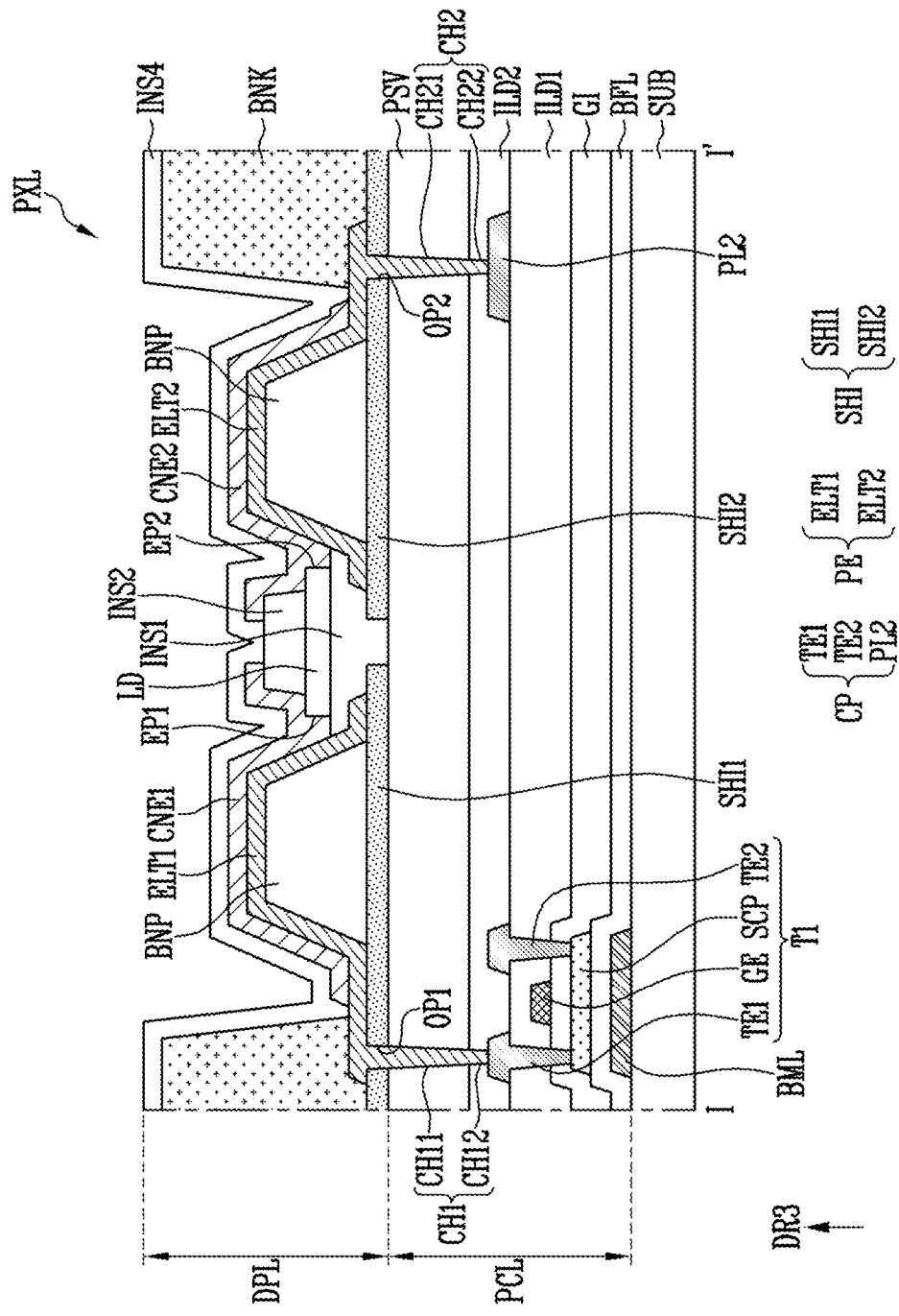

FIGS. 9 and 10 are schematic sectional views taken along line I-I' of FIG. 7. FIGS. 9 and 10 illustrate a first transistor T1 (refer to FIGS. 4 and 5) and a second power line PL2, as examples of circuit elements which may be disposed on a pixel circuit layer PCL.

Referring to FIGS. 3 to 5 and 7 to 10, the display device (or the pixel PXL) may include a substrate SUB, a pixel circuit layer PCL, and a display element layer DPL.

The pixel circuit layer PCL may include a bottom metal layer BML, a buffer layer BFL, a first transistor T1, a conductive layer CP (or a conductor, a conductive pattern), insulating layers GI, ILD1, and ILD2, a shielding electrode SHI, and a passivation layer PSV.

The bottom metal layer BML may be disposed between the substrate SUB and the buffer layer BFL. The bottom metal layer BML may be included in the first transistor T1. The bottom metal layer BML and a gate electrode GE of the first transistor T1 may overlap each other with the buffer layer BFL interposed therebetween. The bottom metal layer BML may be disposed under a semiconductor pattern SCP of the first transistor T1. Here, the bottom metal layer BML may function as a light shielding pattern to stabilize operation characteristics of the first transistor T1.

In an embodiment, the first transistor T1 may not include the bottom metal layer BML. The buffer layer BFL may be disposed directly on the substrate SUB. Furthermore, the bottom metal layer BML may be physically and/or electrically connected with the first transistor electrode TE1 of the first transistor T1, which will be described below, through a contact hole of an insulating layer. Hence, the threshold voltage of the first transistor T1 may be shifted in a negative direction or a positive direction.

The buffer layer BFL may cover the substrate SUB and the bottom metal layer BML and be disposed on the substrate SUB.

The buffer layer BFL may prevent impurities from diffusing into the pixel circuit layer PCL. The buffer layer BFL may be an inorganic insulating layer formed of inorganic material. For example, the buffer layer BFL may include at least one of silicon nitride ($SiN_x$), silicon oxide ($SiO_x$) silicon oxynitride ($SiO_xN_y$) and metal oxides such as aluminum oxide ($AlO_x$). The buffer layer BFL may be omitted depending on the material of the substrate SUB or processing conditions.

The first transistor T1 may include a semiconductor pattern SCP, a gate electrode GE, a first transistor electrode TE1, and a second transistor electrodes TE2. For example, the first transistor electrode TE1 may be a drain electrode, and the second transistor electrode TE2 may be a source electrode. In an embodiment, the first transistor electrode TE1 may be a source electrode, and the second transistor electrode TE2 may be a drain electrode.

The semiconductor pattern SCP may be disposed on the buffer layer BFL. The semiconductor pattern SCP may include a first area (e.g., a drain area) connected to the first transistor electrode TE1, a second area (e.g., a source area) connected to the second transistor electrode TE2, and a channel area formed between the first and second areas. The channel area may overlap the gate electrode GE of the first transistor T1. The semiconductor pattern SCP may be a semiconductor pattern formed of polycrystalline silicon, amorphous silicon, an oxide semiconductor, etc.

The gate insulating layer GI may be disposed on the semiconductor pattern SCP to cover the semiconductor pattern SCP and the buffer layer BFL. The gate insulating layer GI may be an inorganic insulating layer including inorganic material. For example, the gate insulating layer GI may include at least one of silicon nitride ($SiN_x$), silicon oxide ($SiO_x$), silicon oxynitride ($SiO_xN_y$), and metal oxides such as aluminum oxide ($AlO_x$). In an embodiment, the gate insulating layer GI may be formed of an organic insulating layer including organic material. The gate insulating layer GI may be provided in a single-layer structure, or may also be provided in a multilayer structure having two or more layers.

The gate electrode GE may be disposed on the gate insulating layer GI to overlap the channel area of the semiconductor pattern SCP. The gate electrode GE may have a single-layer structure formed of one or more selected from the group consisting of copper (Cu), molybdenum (Mo), tungsten (W), neodymium (Nd), titanium (Ti), aluminum (Al), silver (Ag), and an alloy thereof (e.g. aluminum neodymium (AlNd)). Furthermore, the gate electrode GE may have a double-layer or multi-layer structure formed of molybdenum (Mo), titanium (Ti), copper (Cu), aluminum (Al), and/or silver (Ag), which may be low-resistance materials.

The first interlayer insulating layer ILD1 may be disposed on the gate electrode GE to cover the gate electrode GE and the gate insulating layer GI. The first interlayer insulating layer ILD1 may include the same material as that of the gate insulating layer GI, or may include one or more materials selected from among materials such as the material for forming the gate insulating layer GI.

The first interlayer insulating layer ILD1 may include a contact hole to be used to connect the first transistor electrode TE1 of the first transistor T1 and the second transistor electrode TE2 of the first transistor T1 to the first area and the second area of the semiconductor pattern SCP, respectively.

The conductive layer CP may be disposed on the first interlayer insulating layer ILD1. The conductive layer CP may include the first transistor electrode TE1 of the first transistor T1, the second transistor electrode TE2 of the first transistor T1, and the second power line PL2.

The first transistor electrode TE1 and the second transistor electrode TE2 may be respectively connected to the first area and the second area of the semiconductor pattern SCP through contact holes which successively pass through the gate insulating layer GI and the first interlayer insulating layer ILD1.

The second power line PL2 may have the same configuration as that of the second power line PL2 described with reference to FIGS. 4 and 5. Hence, a voltage of the second power supply VSS may be applied to the second power line PL2. Although not illustrated, the pixel circuit layer PCL may further include the first power line connected to the first power supply. The first power line may be electrically connected to a component of the display element layer DPL, e.g., the first electrode ELT1 of the display element layer DPL. The second power line PL2 may be electrically connected to another component of the display element layer DPL, e.g., the second electrode ELT2 of the display element layer DPL.

Although in an embodiment there has been described that the second power line PL2 is disposed on the same layer as that of the first transistor electrode TE1 and the second transistor electrode TE2 of the first transistor T1, the disclosure is not limited thereto. In an embodiment, the second power line PL2 may be provided on the same layer as that of any one conductive layer of the conductive layers provided on the pixel circuit layer PCL.

The second interlayer insulating layer ILD2 may be disposed on the first interlayer insulating layer ILD1 to cover the first interlayer insulating layer ILD1 and the conductive layer CP. The second interlayer insulating layer ILD2 may be an inorganic insulating layer including inorganic material or an organic insulating layer including organic material. In an embodiment, the second interlayer insulating layer ILD2 may include the same material as that of the first interlayer insulating layer ILD1, but the disclosure is not limited thereto. Although the second interlayer insulating layer ILD2 may be provided in a single-layer structure, the second interlayer insulating layer ILD2 may be provided in a multi-layer structure having two or more layers. In an embodiment, the second interlayer insulating layer ILD2 may be omitted.

The second interlayer insulating layer ILD2 may include a 1-2-th contact hole CH12 which exposes the first transistor electrode TE1 of the first transistor T1, and a 2-2-th contact hole CH22 which exposes the second power line PL2. The 1-2-th contact hole CH12 along with a 1-1-th contact hole CH11 to be described below may form the first contact hole CH1. The first transistor electrode TE1 of the first transistor T1 may be physically and/or electrically connected with the first electrode ELT1 through the first contact hole CH1. The 2-2-th contact hole CH22 along with a 2-1-th contact hole CH21 to be described below may form the second contact hole CH2. The second power line PL2 may be physically and/or electrically connected with the second electrode ELT2 through the second contact hole CH2.

The passivation layer PSV may be disposed on the second interlayer insulating layer ILD2 (or the conductive layer CP).

The passivation layer PSV may include an inorganic insulating layer and/or an organic insulating layer. The inorganic insulating layer may include at least one of silicon oxide ($SiO_x$), silicon nitride ($SiN_x$), silicon oxynitride ($SiO_xN_y$), and metal oxides such as aluminum oxide ($AlO_x$). The organic insulating layer may include at least one of polyacrylates resin, epoxy resin, phenolic resin, polyamides resin, polyimides resin, unsaturated polyesters resin, polyphenylen ethers resin, poly-phenylene sulfides resin, and benzocyclobutene resin.

The passivation layer PSV may include a 1-1-th contact hole CH11 which exposes the first transistor electrode TE1 of the first transistor T1, and a 2-1-th contact hole CH21 which exposes the second power line PL2. The 1-1-th contact hole CH11 along with the 1-2-th contact hole CH12 described above may form the first contact hole CH1. The first transistor electrode TE1 of the first transistor T1 may be physically and/or electrically connected with the first electrode ELT1 through the first contact hole CH1. The 2-1-th contact hole CH21 along with 2-2-th contact hole CH22 described above may form the second contact hole CH2. The second power line PL2 may be physically and/or electrically connected with the second electrode ELT2 through the second contact hole CH2.

The display element layer DPL may be disposed on the passivation layer PSV.

The display element layer DPL may include a shielding electrode SHI, a bank pattern BNP, a pixel electrode layer PE, a bank BNK, a light emitting element LD, a first contact electrode CNE1, a second contact electrode CNE2, and insulating layers INS1, INS2, INS3, and INS4. In an embodiment, the shielding electrode SHI may be included in the pixel circuit layer PCL.

The shielding electrode SHI may be disposed on the passivation layer PSV. The shielding electrode SHI may include a first shielding electrode SHI1 and a second shielding electrode SHI2 which may be spaced apart from each other.

The first shielding electrode SHI1 may include the first contact opening OP1. The second shielding electrode SHI2 may include the second contact opening OP2.

The first contact opening OP1 may expose a portion of an upper surface of the first transistor electrode TE1 of the first transistor T1. In the first contact opening OP1, the first transistor electrode TE1 of the first transistor T1 may be physically and/or electrically connected with the first electrode ELT1 through the first contact hole CH1.

The second contact opening OP2 may expose a portion of an upper surface of the second power line PL2. The second power line PL2 may be physically and/or electrically connected to the second electrode ELT2 through the second contact hole CH2 in the second contact opening OP2.

The shielding electrode SHI may be generally disposed between the conductive layer CP and the pixel electrode layer PE, so that in case alignment voltages (or signals) may be applied to the first electrode ELT1 and the second electrode ELT2, a cross torque, an electric difference, etc. resulting from a capacitance formed between the conductive layer CP and the pixel electrode layer PE can be blocked.

The shielding electrode SHI may include at least one of various metal materials including silver (Ag), magnesium (Mg), aluminum (Al), platinum (Pt), palladium (Pd), gold (Au), nickel (Ni), neodymium (Nd), iridium (Ir), chrome (Cr), titanium (Ti), molybdenum (Mo), copper (Cu), etc., and an alloy thereof. For example, the shielding electrode SHI may include titanium (Ti). However, the disclosure is not limited thereto, and the shielding electrode SHI may include transparent metal material. For example, the shielding electrode SHI may include material such as indium tin oxide (ITO), indium zinc oxide (IZO), zinc oxide ($ZnO_x$), indium gallium zinc oxide (IGZO), aluminum doped zinc oxide (AZO), gallium doped zinc oxide (GZO), and/or zinc tin oxide (ZTO). The zinc oxide ($ZnO_x$) may be zinc oxide (ZnO) and/or zinc peroxide ($ZnO_2$). A separate opaque material layer may be provided and/or formed on the shielding electrode SHI.

The bank pattern BNP may be disposed on the shielding electrode SHI. For example, the bank pattern BNP may be disposed on each of the first shielding electrode SHI1 and the second shielding electrode SHI2.

The bank pattern BNP may have a trapezoidal cross-section which may be reduced in width from one surface (e.g., an upper surface) of the passivation layer PSV upward in the third direction DR3. In an embodiment, the bank pattern BNP may include a curved surface having a cross-sectional shape such as a semi-elliptical shape or a semi-circular shape (or a hemispherical shape) which may be reduced in width from one surface of the passivation layer PSV upward in the third direction DR3. In a sectional view, the shape of the bank pattern BNP is not limited to the foregoing examples, and may be changed in various ways within a range in which the efficiency of light emitted from each of the light emitting elements LD can be enhanced.

The bank pattern BNP may be an inorganic insulating layer including inorganic material or an organic insulating layer including organic material. In an embodiment, the bank pattern BNP may include an organic insulating layer having a single-layer structure and/or an inorganic insulating layer having a single-layer structure, but the disclosure is not limited thereto. In some embodiments, the bank pattern BNP may be omitted.

The pixel electrode layer PE may be disposed on the passivation layer PSV and the bank pattern BNP. The pixel electrode layer PE may include the first electrode ELT1 and the second electrode ELT2.

The first electrode ELT1 and the second electrode ELT2 may be disposed on the bank pattern BNP. In a sectional view, the first electrode ELT1 and the second electrode ELT2 each may have a surface profile corresponding to the shape of the bank pattern BNP. In an embodiment, in case that the bank pattern BNP is omitted, the first and second electrodes ELT1 and ELT2 may be disposed on the first and second shielding electrodes SHI1 and SHI2. The first electrode ELT1 may contact the first shielding electrode SHI1. The second electrode ELT2 may contact the second shielding electrode SHI2.

The first electrode ELT1 and the second electrode ELT2 each may be formed of material having a reflectivity to enable light emitted from the light emitting element LD to travel in an image display direction (e.g., in the third direction DR3) of the display device. For example, the first electrode ELT1 and the second electrode ELT2 each may include metal such as silver (Ag), magnesium (Mg), aluminum (Al), platinum (Pt), palladium (Pd), gold (Au), nickel (Ni), neodymium (Nd), iridium (Ir), chrome (Cr), titanium (Ti), an alloy thereof, or a combination thereof. The first electrode ELT1 and the second electrode ELT2 each may be formed of a single layer or multiple layers including the foregoing metal. In an embodiment, the first electrode ELT1 and the second electrode ELT2 each may include conductive oxide such as indium tin oxide (ITO), indium zinc oxide (IZO), zinc oxide ($ZnO_x$), indium gallium zinc oxide (IGZO), indium tin zinc oxide (ITZO), or a combination thereof, and a conductive polymer such as PEDOT (poly(3, 4-ethylenedioxythiophene)). The zinc oxide ($ZnO_x$) may be zinc oxide (ZnO) and/or zinc peroxide ($ZnO_2$).

The first electrode ELT1 may be physically and/or electrically connected with the first transistor electrode TE1 of the first transistor T1 through the first contact hole CH1.

The second electrode ELT2 may be physically and/or electrically connected with the second power line PL2 through the second contact hole CH2.

The first electrode ELT1 and the second electrode ELT2 may be provided in shapes different from that of the conductive layer CP. The first electrode ELT1 and the second electrode ELT2 may be provided at positions different from that of the conductive layer CP. Hence, if a voltage is applied to the conductive layer CP and a voltage is applied to the pixel electrode layer PE, a capacitance may occur between the conductive layer CP and the pixel electrode layer PE, and a difference in electric field between areas may be caused.

In an embodiment, since the shielding electrode SHI is disposed between the pixel electrode layer PE and the conductive layer CP, a capacitance and an electric field difference may be prevented from occurring between the conductive layer CP and the pixel electrode layer PE. Therefore, in an embodiment, the light emitting elements LD may be aligned in a desired way in case that the light emitting elements LD are aligned by applying an alignment voltage (or a signal) to the pixel electrode layer PE.

In an embodiment, the electrical conductivity of the shielding electrode SHI (or the first and second shielding electrodes SHI1 and SHI2) may be less than that of the pixel electrode layer PE (or the first and second electrodes ELT1 and ELT2). In other words, the shielding electrode SHI may include material having a relatively low electrical conductivity. The pixel electrode layer PE may include material having a relatively high electrical conductivity. For example, the shielding electrode SHI may include titanium (Ti). The pixel electrode layer PE may include aluminum (Al).

Furthermore, the thickness (e.g., the thickness with respect to the third direction DR3) of the shielding electrode SHI (or the first and second shielding electrodes SHI1 and SHI2) may be less than that of the pixel electrode layer PE (or the first and second electrodes ELT1 and ELT2). For example, the thickness of the shielding electrode SHI may be less than about one-half (½) of the thickness of the first and second electrodes ELT1 and ELT2. For example, the thickness of the first and second electrodes ELT1 and ELT2 may range from about 1500 Å to about 3000 Å or may be about 2000 Å. The thickness of the shielding electrode SHI may range from about 500 Å to about 1000 Å or may be about 700 Å

In case that the first and second electrodes ELT1 and ELT2 each have a relatively high electrical conductivity and a relatively large thickness, an electrical field may be intensively formed between the first and second electrodes ELT1 and ELT2 during a process of aligning the light emitting elements LD, and current that flows to the light emitting elements LD may be relatively focused on the first and second electrodes ELT1 and ELT2. In other words, as illustrated in FIG. 7, the light emitting elements LD may be uniformly aligned between the first and second electrodes ELT1 and ELT2.

In case that the first and second shielding electrodes SHI1 and SHI2 each have a relatively low electrical conductivity and a relatively small thickness, an electrical field may seldom be formed between the first and second shielding electrodes SHI1 and SHI2 during the process of aligning the light emitting elements LD. In other words, the light emitting elements LD that may be aligned between the first and second electrodes ELT1 and ELT2 may be prevented from being misaligned on the first and second shielding electrodes SHI1 and SHI2. Hence, the electrical conductivity of each of the first and second shielding electrodes SHI1 and SHI2 may be as low as possible, and the thickness of each of the first and second shielding electrodes SHI1 and SHI2 may be as small as possible. Here, to block light from traveling from the light emitting elements LD downward (e.g., in a direction opposite to the third direction DR3), the thickness of each of the first and second shielding electrodes SHI1 and SHI2 may be at least about 500 Å.

Although the first distance D1 between the first and second shielding electrodes SHI1 and SHI2 and the second distance D2 between the first and second electrodes ELT1 and ELT2 have been described with reference to FIGS. 7 and 8, repetitive explanation thereof will be omitted.

The first insulating layer INS1 may be disposed on the passivation layer PSV to cover at least a portion of each of the first and second electrodes ELT1 and ELT2. The first insulating layer INS1 may be disposed between the first electrode ELT1 and the second electrode ELT2 so that the first electrode ELT1 and the second electrode ELT2 may be prevented from short-circuiting with each other. Likewise, the first insulating layer INS1 may be disposed between the first shielding electrode SHI1 and the second shielding electrode SHI2 so that the first shielding electrode SHI1 and the second shielding electrode SHI2 may be prevented from short-circuiting with each other.

In an embodiment, the first insulating layer INS1 may be primarily formed to cover the overall surfaces of the first and second electrodes ELT1 and ELT2. As such, after the first and second electrodes ELT1 and ELT2 that have been formed, the first and second electrodes ELT1 and ELT2 may be covered with the first insulating layer INS1 and thus can be prevented from being damaged during a subsequent process. After the light emitting elements LD may be supplied and aligned, the first insulating layer INS1 may be partially open to expose an area of each of the first and second electrodes ELT1 and ELT2.

The first insulating layer INS1 may be formed of an inorganic insulating layer including inorganic material, or an organic insulating layer including organic material. For example, the first insulating layer INS1 may include at least one of silicon nitride ($SiN_x$), silicon oxide ($SiO_x$), silicon oxynitride ($SiO_xN_y$), and metal oxides such as aluminum oxide ($AlO_x$), but the disclosure is not limited thereto. The first insulating layer INS1 may be formed of an inorganic insulating layer or an organic insulating layer having an advantage in protecting the light emitting elements LD from the pixel circuit layer PCL.

The light emitting element LD may be disposed on the first insulating layer INS1. The first end EP1 of the light emitting element LD may be disposed to face the first electrode ELT1. The second end EP2 of the light emitting element LD may be disposed to face the second electrode ELT2.

The first end EP1 of the light emitting element LD may partially overlap the first electrode ELT1 in the third direction DR3. The second end EP2 of the light emitting element LD may partially overlap the second electrode ELT2 in the third direction DR3.

The bank BNK may be disposed on the passivation layer PSV. The bank BNK may be disposed to at least partially overlap the first electrode ELT1 and the second electrode ELT2. At the step of supplying the light emitting elements LD to the emission area EMA, the bank BNK may be a dam structure that prevents a solution including the light emitting elements LD from being drawn into the emission area EMA of an adjacent pixel PXL or control the amount of solution such that a constant amount of solution may be supplied to each emission area EMA.

The bank BNK may include light shielding material and/or reflective material, thus preventing a light leakage defect in which light (or rays) leaks between each pixel PXL and the pixels PXL adjacent thereto. In some embodiments, the bank BNK may include transparent material. For example, the bank BNK may include polyamides resin, polyimides resin, etc., but the disclosure is not limited thereto. For example, the bank BNK may include color filter material or black matrix material. In other embodiments, in order to enhance the efficiency of light emitted from the pixel PXL, a separate reflective material layer may be provided and/or formed on the bank BNK.

Although in an embodiment the bank BNK has been described as being disposed on the passivation layer PSV, the disclosure is not limited thereto. In an embodiment, in case that the first insulating layer INS1 is disposed in the non-emission area NEA, the bank BNK may be disposed on the first insulating layer INS1 and disposed to partially overlap the first electrode ELT1 and the second electrode ELT2.

A second insulating layer INS2 may be disposed on the light emitting element LD. The second insulating layer INS2 may be disposed on a portion of the upper surface of the light emitting element LD such that the first end EP1 and the second end EP2 of the light emitting element LD may be exposed to the outside.

The second insulating layer INS2 may be formed of an organic insulating layer including organic material, depending on design conditions, etc. of the display device including the light emitting elements LD. After the arrangement of the light emitting elements LD in the pixel area PXA (refer to FIG. 7) have been completed, the second insulating layer INS2 may be disposed on the light emitting elements LD so that the light emitting elements LD may be prevented from being removed from the aligned positions.

In the case where a gap (or space) is present between the first insulating layer INS1 and the light emitting element LD before the formation of the second insulating layer INS2, the gap may be filled with the second insulating layer INS2 during a process of forming the second insulating layer INS2. The second insulating layer INS2 may be formed of an organic insulating layer that has an advantage in filling the gap between the first insulating layer INS1 and the light emitting elements LD with the second insulating layer INS2.

The second insulating layer INS2 may have a single-layer structure or a multi-layer structure, and include an inorganic insulating layer including at least one inorganic material or an organic insulating layer including at least one organic material. For example, the second insulating layer INS2 may include at least one of silicon nitride ($SiN_x$) silicon oxide ($SiO_x$), silicon oxynitride ($SiO_xN_y$), and metal oxides such as aluminum oxide ($AlO_x$), but the disclosure is not limited thereto.

The first contact electrode CNE1 may be disposed on the first electrode ELT1 to cover the first electrode ELT1, and overlap the first insulating layer INS1, the light emitting element LD, and the second insulating layer INS2.

The first contact electrode CNE1 may directly contact the first end EP1 of the light emitting element LD and the first electrode ELT1, and physically and/or electrically reliably connect the first end EP1 of the light emitting element LD to the first electrode ELT1.

The first contact electrode CNE1 may include transparent conductive material such as indium tin oxide (ITO), indium zinc oxide (IZO), zinc oxide ($ZnO_x$), and/or indium gallium zinc oxide (IGZO). The zinc oxide ($ZnO_x$) may be zinc oxide (ZnO) and/or zinc peroxide ($ZnO_2$).

The third insulating layer INS3 may be disposed on the second insulating layer INS2 and the first contact electrode CNE1 to cover the second insulating layer INS2 and the first contact electrode CNE1. The third insulating layer INS3 may be disposed such that a perimeter thereof comes into contact with one end of the second insulating layer INS2 so that the second end EP2 of the light emitting element LD is exposed.

The third insulating layer INS3 may be an inorganic insulating layer including inorganic material or an organic insulating layer including organic material. For example, the third insulating layer INS3 may include at least one of silicon nitride ($SiN_x$) silicon oxide ($SiO_x$) silicon oxynitride ($SiO_xN_y$) and metal oxides such as aluminum oxide ($AlO_x$) but the disclosure is not limited thereto.

The second contact electrode CNE2 may be disposed on the second electrode ELT2 to cover the second electrode ELT2, and overlap the first insulating layer INS1, the light emitting element LD, and the third insulating layer INS3.

The second contact electrode CNE2 may directly contact the second end EP2 of the light emitting element LD and the second electrode ELT2, and physically and/or electrically reliably connect the second end EP2 of the light emitting element LD to the second electrode ELT2.

The second contact electrode CNE2 may include transparent conductive material such as indium tin oxide (ITO), indium zinc oxide (IZO), zinc oxide ($ZnO_x$), and indium gallium zinc oxide (IGZO). The zinc oxide ($ZnO_x$) may be zinc oxide (ZnO) and/or zinc peroxide ($ZnO_2$).

The fourth insulating layer INS4 may be disposed on the third insulating layer INS3, the second contact electrode CNE2, and the bank BNK to cover the third insulating layer INS3, the second contact electrode CNE2, and the bank BNK.

The fourth insulating layer INS4 may be an inorganic insulating layer including inorganic material or an organic insulating layer including organic material. For example, the fourth insulating layer INS4 may have a structure formed by alternately stacking at least one inorganic insulating layer and at least one organic insulating layer on each other. The fourth insulating layer INS4 may cover the entirety of the display element layer DPL and prevent water or moisture from being drawn into the display element layer DPL including the light emitting elements LD from the outside.

Although in FIG. 9 there has been described that the first contact electrode CNE1 and the second contact electrode CNE2 may be disposed on different layers with the third insulating layer INS3 interposed therebetween, the disclosure is not limited thereto. For example, as illustrated in FIG. 10, the first contact electrode CNE1 and the second contact electrode CNE2 may be formed through an identical process and disposed on an identical layer (e.g., the second insulating layer INS2).

In an embodiment, the display element layer DPL may selectively further include an optical layer as well as including the fourth insulating layer INS4. For example, the display element layer DPL may further include a color conversion layer including color conversion particles for converting the color of light emitted from the light emitting elements LD to a specific color of light. Furthermore, the display element layer DPL may further include a color filter that allows light of only a specific wavelength band to pass therethrough.

In an embodiment, at least one overcoat layer (e.g., a layer for planarizing an upper surface of the display element layer DPL) may be further disposed over the fourth insulating layer INS4.

As described above, the first and second shielding electrodes SHI1 and SHI2 may be respectively disposed under the first and second electrodes ELT1 and ELT2, and block an electric field (or an electric field effect) which may occur between the first and second electrodes ELT1 and ELT2 and conductors provided under the first and second shielding electrodes SHI1 and SHI2. Therefore, the light emitting element LD may be prevented from being misaligned by an electric field resulting from the conductors.

Furthermore, the first and second shielding electrodes SHI1 and SHI2 each may have a relatively low electrical conductivity and a relatively small thickness. Therefore, despite the fact that the first and second shielding electrodes SHI1 and SHI2 respectively contact the first and second electrodes ELT1 and ELT2, an electrical field may seldom be formed between the first and second shielding electrodes SHI1 and SHI2 during the process of aligning the light emitting element LD, so that the light emitting elements LD may be prevented from being misaligned between the first and second shielding electrodes SHI1 and SHI2.

Moreover, since the first and second shielding electrodes SHI1 and SHI2 each may include opaque material having a thickness of at least about 500 Å (e.g., about 700 Å), light may be blocked from traveling from the light emitting element LD downward.

Figure 11:
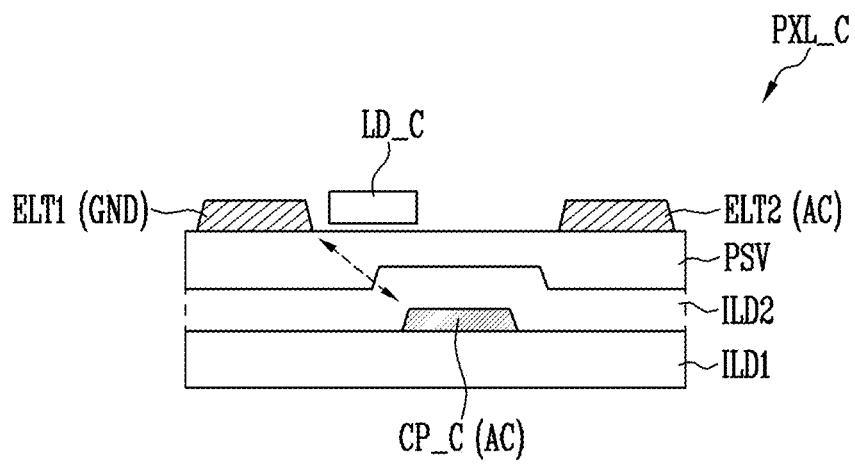
FIGS. 11 and 12 are schematic views illustrating a pixel in accordance with a comparative embodiment.

FIGS. 11 and 12 are schematic views illustrating a pixel PXL_C in accordance with a comparative embodiment. FIG. 13 is a schematic view for describing effects of the pixel PXL of FIGS. 9 and 10. For the sake of explanation, FIG. 13 simply illustrates only some components of the pixel PXL of FIGS. 9 and 10.

First, referring to FIGS. 7 to 12, the pixel PXL_C in accordance with the comparative embodiment may correspond to the pixel PXL of FIG. 9, but the pixel PXL_C of FIGS. 11 and 12 may not include a shielding electrode SHI (refer to FIG. 9).

The pixel PXL_C may include a conductive pattern CP_C disposed on the first interlayer insulating layer ILD1. For example, the conductive pattern CP_C may be the second power line PL2 (refer to FIG. 9). For reference, although, in a plan view, the second power line PL2 may generally extend in the second direction DR2, the second power line PL2 may have a partially bent shape to prevent a short-circuit with other components (e.g., the source/drain electrodes of the transistor) disposed on the same layer. Hence, in a plan view, at a specific point of the pixel PXL_C, the conductive pattern CP_C may be disposed between the first and second electrodes ELT1 and ELT2. As illustrated in FIG. 12, in a plan view, at least a portion of the conductive pattern CP_C may be disposed between the first and second electrodes ELT1 and ELT2 rather than overlapping the first and second electrodes ELT1 and ELT2.

To align a light emitting element LD_C, alignment voltages (or signals) may be applied to the first and second electrodes ELT1 and ELT2. For example, a ground voltage GND may be applied to the first electrode ELT1, and an alternating current voltage (AC) may be applied to the second electrode ELT2. An electric field may be formed between the first electrode ELT1 and ELT2, and the light emitting element LD_C may be aligned between the first electrode ELT1 and the second electrode ELT2.

Here, in case that the second electrode ELT2 is electrically connected to the conductive pattern CP_C, an AC may also be applied to the conductive pattern CP_C, and an electric field may also be formed between the first electrode ELT1 and the conductive pattern CP_C. Therefore, the light emitting element LD_C may be misaligned between the first electrode ELT1 and the conductive pattern CP_C, rather than being aligned between the first electrode ELT1 and the second electrode ELT2. As illustrated in FIG. 12, the light emitting element LD_C may be aligned in a diagonal direction. The light emitting element LD_C may not be electrically connected between the first and second electrodes ELT1 and ELT2 and may thus not emit light. Therefore, the emission efficiency of the pixel PXL_C may be reduced. Furthermore, in case that one end of the light emitting element LD_C (e.g., one end disposed between the first and second electrodes ELT1 and ELT2 without overlapping the first and second electrodes ELT1 and ELT2) contacts both the first and second contact electrodes CNE1 and CNE2, a short-circuit may be caused between the first and second electrodes ELT1 and ELT2, so that the pixel PXL_C may not emit light.

Figure 13:
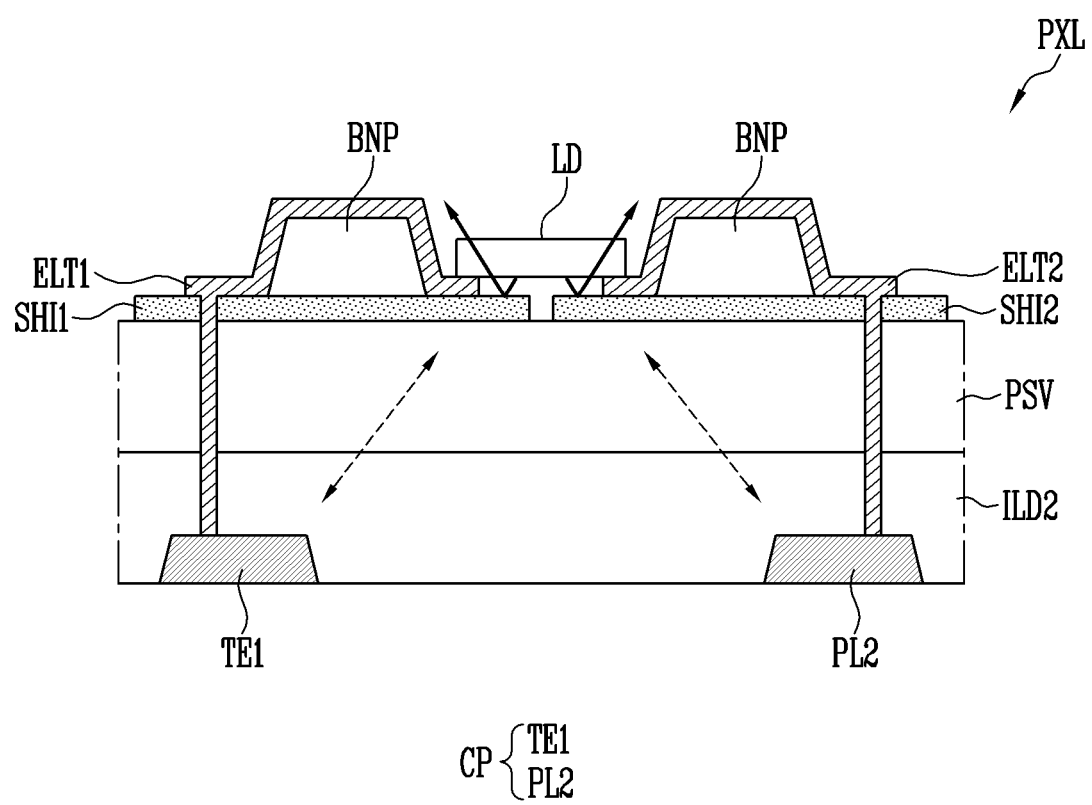
FIG. 13 is a schematic view for describing effects of the pixel of FIGS. 9 and 10.

Referring to FIG. 13, the pixel PXL in accordance with an embodiment of the disclosure may include the first and second shielding electrodes SHI1 and SHI2 disposed under the first and second electrodes ELT1 and ELT2. The first and second shielding electrodes SHI1 and SHI2 may respectively substantially cover the first and second electrodes ELT1 and ELT2. The first and second shielding electrodes SHI1 and SHI2 may block an electric field (or an electric field effect) which may occur between conductors (e.g., the first transistor electrode TE1 and the second power line PL2 that may be included in the conductive layer CP) provided under the first and second shielding electrodes SHI1 and SHI2. Therefore, the light emitting element LD may be prevented from being misaligned by an electric field resulting from the conductors.

Furthermore, the first and second shielding electrodes SHI1 and SHI2 may substantially cover lower portions of the light emitting element LD and thus block light from traveling from the light emitting element LD downward. In case that light that travels downward is incident on the semiconductor pattern of the transistor, the transistor may deteriorate. For example, in case that the semiconductor pattern includes an oxide semiconductor, a defect may occur in vacant space (e.g., an oxygen vacancy) in which charges can freely move, and the conductivity of the transistor may be increased. The first and second shielding electrodes SHI1 and SHI2 may prevent the transistor from deteriorating. In an embodiment, in case that the first and second shielding electrodes SHI1 and SHI2 reflects light, the emission efficiency of the pixel PXL may be enhanced.

Figure 14:
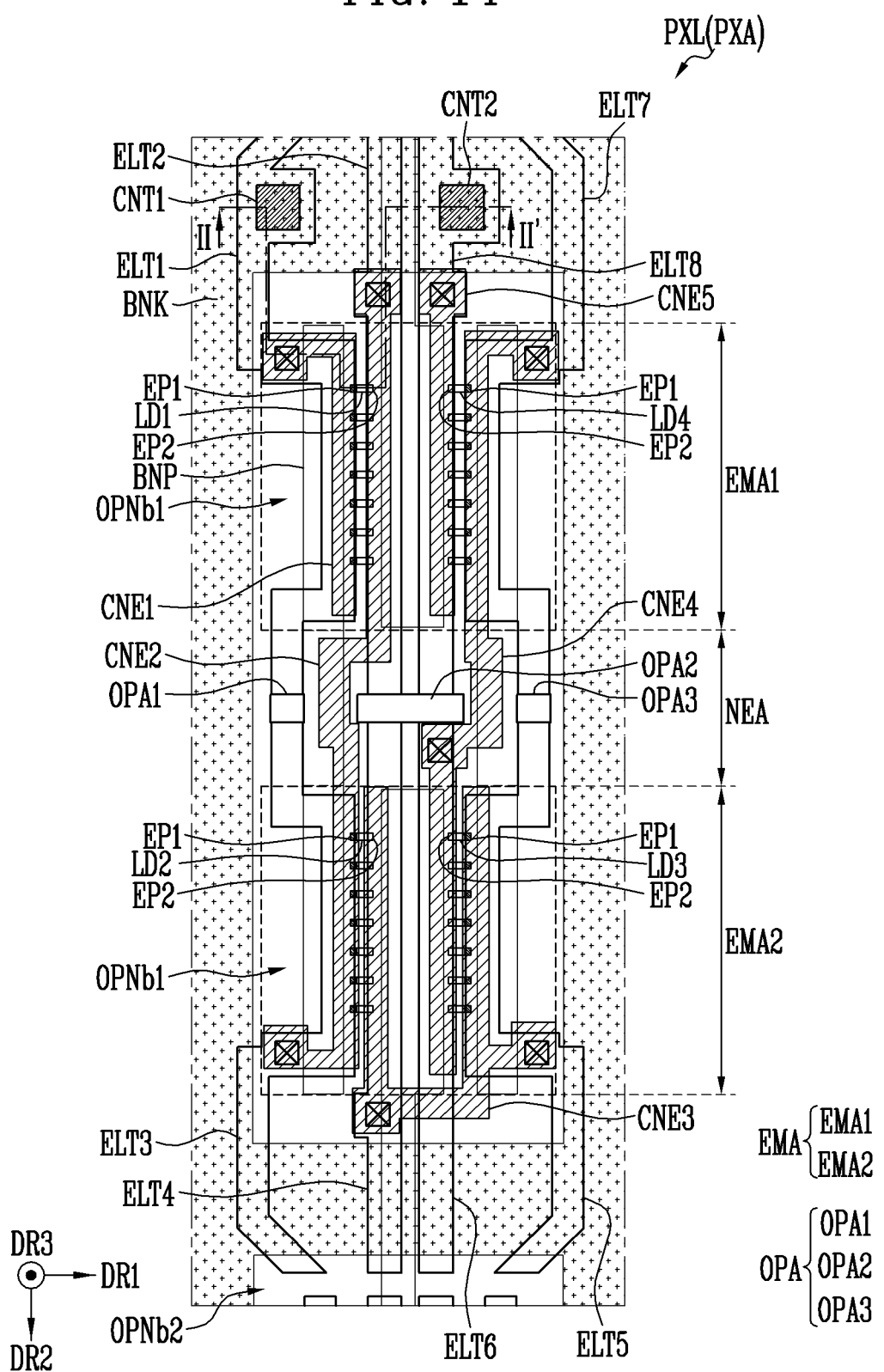
FIG. 14 is a schematic plan view illustrating an embodiment of the pixel of FIG. 6.

FIG. 14 is a schematic plan view illustrating an embodiment of the pixel PXL of FIG. 6. Although FIG. 14 illustrates an embodiment in which the pixel PXL includes light emitting elements LD disposed in four serial sets, the number of serial sets in the pixel PXL may be changed in various ways depending on embodiments.

Hereinafter, the term "light emitting element LD" or "light emitting elements LD" will be used to arbitrarily designate at least one light emitting element of the first to fourth light emitting elements LD1 to LD4, or collectively designate two or more kinds of light emitting elements. Furthermore, the term "pixel electrode ELT" or "pixel electrodes ELT" will be used to arbitrarily designate at least one pixel electrode of pixel electrodes including first to eighth electrodes ELT1 to ELT8. The term "contact electrode CNE" or "contact electrodes CNE" will be used to arbitrarily designate at least one contact electrode of contact electrodes including first to fifth contact electrodes CNE1 to CNE5.

Referring to FIGS. 3, 6, 7, 8, and 14, identical or similar reference numerals will be used to designate components of the pixel PXL of FIG. 14 identical or similar to those of the components of the pixel PXL of FIG. 7, and repetitive explanation thereof will be omitted or simplified.

The pixel PXL may include an emission area EMA and a non-emission area NEA. The emission area EMA may include a first emission area EMA1 and a second emission area EMA2 which may be spaced apart from each other. The first emission area EMA1 and the second emission area EMA2 may be disposed in the pixel area PXA and spaced apart from each other in the second direction DR2. The non-emission area NEA may be disposed between the first emission area EMA1 and the second emission area EMA2.

The emission area EMA may include at least one light emitting element LD, and electrodes electrically connected to the light emitting element LD. In an embodiment, in case that, as illustrated in FIG. 6, the pixel PXL includes light emitting elements LD divided into and disposed in serial sets, each of the first and second emission areas EMA1 and EMA2 may include a light emitting element LD disposed in at least one serial set and electrodes electrically connected to the light emitting element LD. For example, the first emission area EMA1 may include first light emitting elements LD1 disposed in a first serial set of the corresponding pixel PXL, and electrodes connected to the first light emitting elements LD1. The second emission area EMA2 may include second light emitting elements LD2 disposed in a second serial set, and electrodes connected to the second light emitting elements LD2. The first light emitting element LD1 disposed in the first emission area EMA1 and the second light emitting element LD2 disposed in the second emission area EMA2 may be connected in series to each other. For example, the first light emitting element LD1 and the second light emitting element LD2 may be connected in series to each other by at least one contact electrode CNE.

In case that each pixel PXL includes serial sets the number of which is greater than the number of emission areas EMA, each of the emission areas EMA may include light emitting elements LD disposed in two or more serial sets, and electrodes electrically connected to the light emitting elements LD. For example, the first emission area EMA1 may include light emitting elements LD1 and LD4 disposed in first and fourth serial sets of the light source unit LSU, and electrodes. The second emission area EMA2 may include light emitting elements LD2 and LD3 disposed in second and third serial sets, and electrodes.

In detail, the pixel PXL may include a first electrode ELT1, a second electrode ELT2, and at least one first light emitting element LD1 that may be disposed in the first emission area EMA1, the first light emitting element LD1 being electrically connected between the first and second electrodes ELT1 and ELT2, and a third electrode ELT3, a fourth electrode ELT4, and at least one second light emitting element LD2 that may be disposed in the second emission area EMA2, the second light emitting element LD2 being electrically connected between the third and fourth electrodes ELT3 and ELT4. Furthermore, the pixel PXL may include a fifth electrode ELT5, a sixth electrode ELT6, and at least one third light emitting element LD3 that may be disposed in the second emission area EMA2, the third light emitting element LD3 being electrically connected between the fifth and sixth electrodes ELT5 and ELT6, and a seventh electrode ELT7, an eighth electrode ELT8, and at least one fourth light emitting element LD4 that may be disposed in the first emission area EMA1, the fourth light emitting element LD4 being electrically connected between the seventh and eighth electrodes ELT7 and ELT8.

Although FIG. 14 illustrates the case where the fifth electrode ELT5, the sixth electrode ELT6, and the third light emitting element LD3 may be disposed in the second emission area EMA2, and the seventh electrode ELT7, the eighth electrode ELT8, and the fourth light emitting element LD4 may be disposed in the first emission area EMA1, the disclosure is not limited thereto. In other words, in an embodiment, the fifth electrode ELT5, the sixth electrode ELT6, and the third light emitting element LD3 may be disposed in the first emission area EMA1, and the seventh electrode ELT7, the eighth electrode ELT8, and the fourth light emitting element LD4 may be disposed in the second emission area EMA2.

In each emission area EMA, the first to eighth electrodes ELT1 to ELT8 each may extend in the second direction DR2. For example, in the first emission area EMA1, the first electrode ELT1, the second electrode ELT2, the seventh electrode ELT7, and/or the eighth electrode ELT8 each may extend in the second direction DR2, and may be successively spaced apart from each other in the first direction DR1. Furthermore, in the second emission area EMA2, the third electrode ELT3, the fourth electrode ELT4, the fifth electrode ELT5, and/or the sixth electrode ELT6 each may extend in the second direction DR2, and may be successively spaced apart from each other in the first direction DR1. The first to eighth electrodes ELT1 to ELT8 may have a uniform width or uneven widths, and each may have or may not have a bent portion. In other words, the respective shapes and the relative disposition structure of the first to eighth electrodes ETT1 to ELT8 may be changed in various ways depending on embodiments.

The first to eighth electrodes ELT1 to ELT8 may form the pixel electrodes ELT of each pixel PXL. The first to eighth electrodes ELT1 to ELT8 may be respectively supplied with a first alignment signal (or a first alignment voltage) and a second alignment signal (or a second alignment voltage) at the step of aligning the light emitting elements LD. Hence, an electric field may be formed between the first to eighth electrodes ELT1 to ELT8 that may be adjacent to each other, so that the light emitting elements LD supplied to the emission area EMA may be self-aligned between the first to eighth electrodes ELT1 to ELT8.

In case that conductors (e.g., the first and second conductive layers CP1 and CP2 of FIG. 15) are present under the first to eighth electrodes ELT1 to ELT8 (or in case that, in a plan view, a conductor is present between a pair of adjacent electrodes of the first to eighth electrodes ELT1 to ELT8), the light emitting elements LD may be abnormally aligned by signal interference of the conductor during the process of aligning the light emitting elements LD. Hence, the pixel PXL in accordance with embodiments of the disclosure may include a shielding electrode SHI (refer to FIG. 15) that covers each of the first to eighth electrodes ELT1 to ELT8, so that, as described with reference to FIG. 13, the signal interference resulting from the conductor may be blocked, and the degree of alignment of the light emitting element LD may be improved.

In an embodiment, some of the first to eighth electrodes ELT1 to ELT8 may be divided into the pixel electrodes ELT of the respective serial sets by forming an alignment line and dividing the alignment line into parts between the pixel PXL and adjacent pixels PXL and/or in the non-emission area NEA between the first and second emission areas EMA1 and EMA2 of each pixel PXL.

In case that each alignment line is divided in the non-emission area NEA, one end of each of the first to eighth electrodes ELT1 to ELT8 may partially extend to the non-emission area NEA. However, the disclosure is not limited thereto.

The non-emission area NEA may provide space for dividing each alignment line into pixel electrodes ELT after the alignment of the light emitting elements LD, or for connection between the pixel electrodes ELT through at least one contact electrode CNE.

In detail, the non-emission area NEA may include an opening OPA for dividing the alignment line into pixel electrodes ELT. The opening OPA may include first to third openings OPA1 to OPA3 spaced apart from each other. The first to third openings OPA1 to OPA3 may be disposed in the first direction DR1 in the non-emission area NEA.

The first opening OPA1 may be disposed between the first electrode ELT1 and the third electrode ELT3. In other words, the first electrode ELT1 and the third electrode ELT3 may be spaced apart from each other with the first opening OPA1 provided therebetween. A width of the first opening OPA1 with respect to the first direction DR1 may be greater than a width of each of the first electrode ELT1 and/or the third electrode ELT3 with respect to the first direction DR1, but the disclosure is not limited thereto.

The second opening OPA2 may be disposed between the second electrode ELT2 and the eighth electrode ELT8 and between the fourth electrode ELT4 and the sixth electrode ELT6. In other words, the second electrode ELT2 and the fourth electrode ELT4 may be spaced apart from each other with the second opening OPA2 provided therebetween. In other words, the sixth electrode ELT6 and the eighth electrode ELT8 may be spaced apart from each other with the second opening OPA2 provided therebetween. A width of the second opening OPA2 with respect to the first direction DR1 may be greater than a width from a first side of second electrode ELT2 to a second side of the eighth electrode ELT8 with respect to the first direction DR1. Likewise, a width of the second opening OPA2 with respect to the first direction DR1 may be greater than a width from a first side of fourth electrode ELT4 to a second side of the sixth electrode ELT6 with respect to the first direction DR1. However, the disclosure is not limited thereto.

The third opening OPA3 may be disposed between the fifth electrode ELT5 and the seventh electrode ELT7. In other words, the fifth electrode ELT5 and the seventh electrode ELT7 may be spaced apart from each other with the third opening OPA3 provided therebetween. A width of the third opening OPA3 with respect to the first direction DR1 may be greater than a width of each of the fifth electrode ELT5 and/or the seventh electrode ELT7 with respect to the first direction DR1, but the disclosure is not limited thereto.

The first to third openings OPA1 to OPA3 may have different sizes. For example, the first opening OPA1 may overlap one alignment line. The second opening OPA2 may overlap alignment lines. The third opening OPA3 may overlap one alignment line. In other words, the width of the second opening OPA2 with respect to the first direction DR1 may be greater than the width of the first opening OPA1 and/or the third opening OPA3 with respect to the first direction DR1.

Although FIG. 14 illustrates the case where the opening OPA is formed of the first to third openings OPA1 to OPA3 spaced apart from each other, the disclosure is not limited thereto. For example, the opening OPA may be formed of an opening extending in the first direction DR1 in the non-emission area NEA. In other words, the opening OPA may extend from a first side of the first electrode ELT1 to a first side of the seventh electrode ELT7. Furthermore, the opening OPA may extend from a first side of the third electrode ELT3 to a first side of the fifth electrode ELT5.

Any one of the above-mentioned pixel electrodes ELT, e.g., the first electrode ELT1, may be electrically connected to the pixel circuit PXC and/or the first power line PL1 through a first contactor CNT1. Another one of the pixel electrodes ELT, e.g., the eighth electrode ELT8, may be electrically connected to the second power line PL2 through a second contactor CNT2.

In an embodiment, the bank pattern BNP may be disposed under an area of each of the first to eighth electrodes ELT1 to ELT8. An area of each of the first to eighth electrodes ELT1 to ELT8 may protrude upward (e.g., in the third direction DR3) by the bank pattern BNP and form a reflective partition wall around the light emitting elements LD. Consequently, the optical efficiency of the pixel PXL may be enhanced. Each bank pattern BNP may be formed to overlap one pixel electrode ELT or multiple pixel electrodes ELT.

In an embodiment, the first to eighth electrodes ELT1 to ELT8 each may be brought into direct contact with and connected to the light emitting elements LD of the corresponding serial set, or may be electrically connected to the light emitting elements LD by a separate contact electrode CNE or the like. For example, the first to eighth electrodes ELT1 to ELT8 each may be insulated from the first ends EP1 or the second ends EP2 of the light emitting elements LD by the first insulating layer INS1, and electrically connected to the first or second ends EP1 or EP2 of the adjacent light emitting elements LD through the corresponding contact electrode CNE.

Furthermore, any one electrode (e.g., one of the first, second, seventh, and eighth electrodes ELT1, ELT2, ELT7, and ELT8) disposed in the first emission area EMA1, and any one electrode (e.g., one of the third to sixth electrodes ELT3 to ELT6) disposed in the second emission area EMA2 may be electrically connected to each other by at least one contact electrode CNE. To this end, each pixel PXL may include first to fifth contact electrodes CNE1 to CNE5 that electrically connect electrodes disposed in the first and second emission areas EMA1 and EMA2 to each other.

The first contact electrode CNE1 may be disposed on the first electrode ELT1 and the first light emitting elements LD1 (particularly, the first ends EP1) of the first serial set, and thus electrically connect the first ends EP1 of the first light emitting elements LD1 of the first serial set to the first electrode ELT1.

The second contact electrode CNE2 may be disposed on the second electrode ELT2 and the first light emitting elements LD1 (particularly, the second ends EP2) of the first serial set, and thus electrically connect the second ends EP2 of the first light emitting elements LD1 to the second electrode ELT2. Furthermore, the second contact electrode CNE2 may be disposed on the third electrode ELT3 and the second light emitting elements LD2 (particularly, the first ends EP1) of the second serial set, and thus electrically connect the first ends EP1 of the second light emitting elements LD2 to the third electrode ELT3. To this end, the second contact electrode CNE2 may extend from the first emission area EMA1 to the second emission area EMA2 via the non-emission area NEA. However, in an embodiment, the second contact electrode CNE2 may be formed of multiple separate electrodes, and the separate electrodes may be electrically connected to each other by a bridge pattern or the like.

The third contact electrode CNE3 may be disposed on the fourth electrode ELT4 and the second light emitting elements LD2 (particularly, the second ends EP2) of the second serial set, and thus electrically connect the second ends EP2 of the second light emitting elements LD2 to the fourth electrode ELT4. Furthermore, the third contact electrode CNE3 may be disposed on the fifth electrode ELT5 and the third light emitting elements LD3 (particularly, the first ends EP1) of the third serial set, and thus electrically connect the first ends EP1 of the third light emitting elements LD3 to the fifth electrode ELT5. However, in an embodiment, the third contact electrode CNE3 may be formed of multiple separate electrodes, and the separate electrodes may be electrically connected to each other by a bridge pattern or the like.

The fourth contact electrode CNE4 may be disposed on the sixth electrode ELT6 and the third light emitting elements LD3 (particularly, the second ends EP2) of the third serial set, and thus electrically connect the second ends EP2 of the third light emitting elements LD3 to the sixth electrode ELT6. Furthermore, the fourth contact electrode CNE4 may be disposed on the seventh electrode ELT7 and the fourth light emitting elements LD4 (particularly, the first ends EP1) of the fourth serial set, and thus electrically connect the first ends EP1 of the fourth light emitting elements LD4 to the seventh electrode ELT7. To this end, the fourth contact electrode CNE4 may extend from the second emission area EMA2 to the first emission area EMA1 via the non-emission area NEA. However, in an embodiment, the fourth contact electrode CNE4 may be formed of multiple separate electrodes, and the separate electrodes may be electrically connected to each other by a bridge pattern or the like.

The fifth contact electrode CNE5 may be disposed on the eighth electrode ELT8 and the fourth light emitting elements LD4 (particularly, the second ends EP2) of the fourth serial set, and thus electrically connect the second ends EP2 of the fourth light emitting elements LD4 to the eighth electrode ELT8.

In an embodiment, at least one insulating layer may be interposed between each contact electrode CNE and the corresponding pixel electrode ELT. Each contact electrode CNE may be electrically connected to the corresponding pixel electrode ELT through a contact hole formed in the insulating layer. However, the electrical connection structure between the contact electrode CNE and the pixel electrode ELT may be changed in various ways.

According to the foregoing embodiment, the pixel electrodes ELT may be electrically connected in a desired shape by the contact electrodes CNE. For example, the first light emitting elements LD1 disposed in a first side of the first emission area EMA1, the second light emitting elements LD2 disposed in a first side of the second emission area EMA2, the third light emitting elements LD3 disposed in a second side of the second emission area EMA2, and the fourth light emitting elements LD4 disposed in a second side of the first emission area EMA1 may be successively connected in series.

The pixel PXL may further include a bank BNK disposed in a perimeter of each pixel area PXA. The bank BNK may be a structure which defines a light output area of each pixel PXL, and be disposed on a boundary between adjacent pixel areas PXA. The bank BNK may be, for example, a pixel define layer. The bank BNK may include at least one light shielding and/or reflective material, thus preventing light leakage between adjacent pixel areas PXA from occurring. For example, the bank BNK may include at least one black matrix material (e.g., at least one light shielding material) among different kinds of black matrix materials, and/or a color filter material having a specific color. For instance, the bank BNK may be formed of a black opaque pattern which can block transmission of light.

The bank BNK may enclose the emission area EMA and the non-emission area NEA. The bank BNK may include a first bank opening OPNb1 which comprehensively exposes the emission area EMA and the non-emission area NEA. In other words, the emission area EMA and the non-emission area NEA may directly abut on each other. The bank BNK may be disposed to enclose a perimeter of an overall area including the emission area EMA and the non-emission area NEA. In an embodiment, the bank BNK may further include a second bank opening OPNb2 corresponding to an upper area and/or a lower area of each pixel area PXA, as well as including the first bank opening OPNb1 that exposes the emission area EMA and the non-emission area NEA of each pixel PXL.

Since the bank BNK may be disposed to enclose the overall area including the emission area EMA and the non-emission area NEA, the bank BNK may not be present in the non-emission area NEA of the pixel area PXA, so that the surface area of the light output area of the pixel PXL may be maximized. However, the light emitting elements LD may be supplied not only to the emission area EMA to which the light emitting elements LD may be applied, but also to the non-emission area NEA. In case that conductors (e.g., the first and second conductive layers CP1 and CP2 of FIG. 15) are present in the non-emission area NEA, the light emitting elements LD may be abnormally aligned even in the non-emission area NEA by signal inference of the conductors. In the pixel PXL in accordance with embodiments of the disclosure, the first to eighth electrodes ELT1 to ELT8 each may be covered with a shielding electrode SHI (refer to FIG. 15) in the non-emission area NEA, so that the light emitting elements LD may be prevented from being abnormally aligned in the non-emission area NEA.

A relationship between the first to eighth electrodes ELT1 to ELT8 and the shielding electrode SHI is substantially equal or similar to that of the first and second electrodes ELT1 and ELT2 and the first and second shielding electrodes SHI1 and SHI2 that are described with reference to FIGS. 7 and 8. Therefore, detailed explanation thereof will be omitted.

Figure 15:
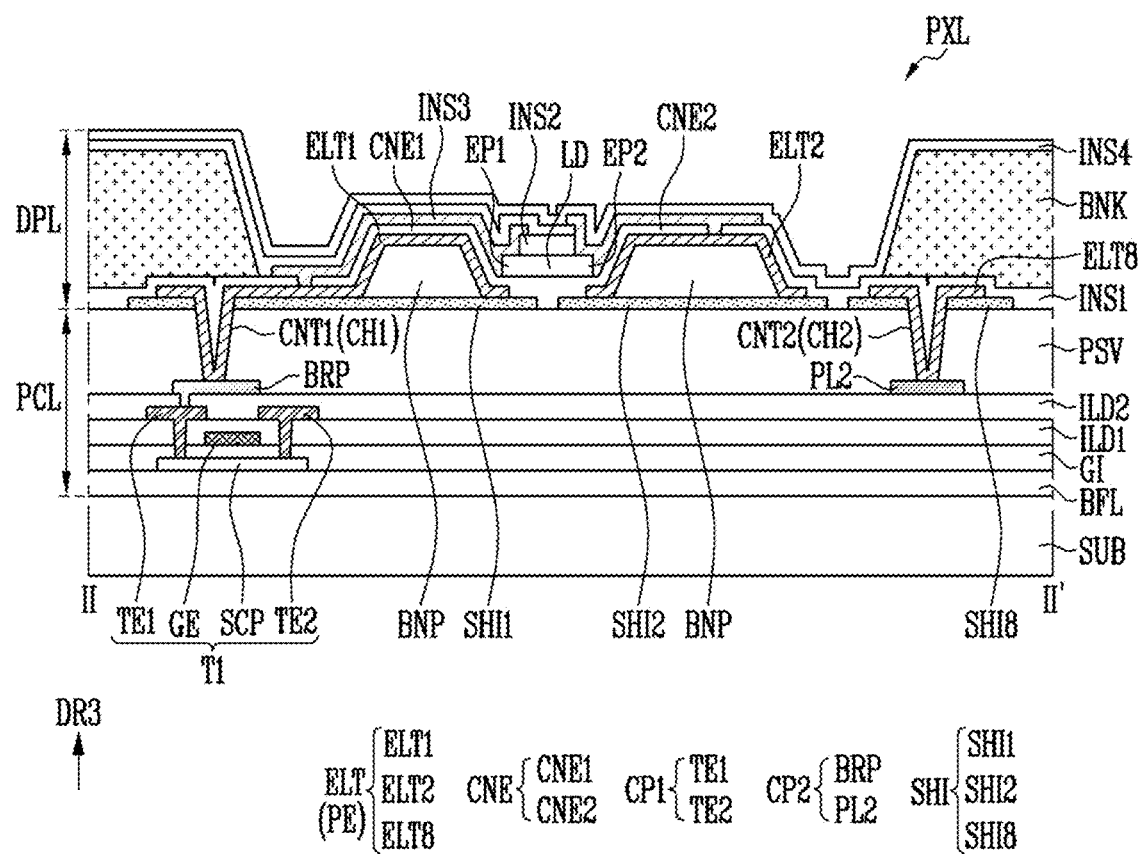
FIG. 15 is a schematic sectional view taken along line II-II' of FIG. 14.

FIG. 15 is a schematic sectional view taken along line II-II' of FIG. 14. FIG. 15 illustrates a first transistor T1 (refer to FIG. 6) and a second power line PL2, as an example of circuit elements which may be disposed on the pixel circuit layer PCL.

Referring to FIGS. 3, 6, 9, 10, 14, and 15, identical or similar reference numerals will be used to designate components of the pixel PXL of FIG. 15 identical or similar to those of the components of the pixel PXL of FIG. 9, and repetitive explanation thereof will be omitted or simplified.

The pixel PXL and the display device including the pixel PXL may include a pixel circuit layer PCL and a display element layer DPL which may be disposed on one surface of the substrate SUB.

Although the pixel circuit layer PCL is illustrated as not including the bottom metal layer (refer to FIG. 9), the disclosure is not limited thereto. For example, as described with reference to FIG. 9, the pixel circuit layer PCL of FIG. 16 may include a bottom metal layer.

A first conductive layer CP1 may be disposed on the first interlayer insulating layer ILD1. The first conductive layer CP1 may include the first and second transistor electrodes TE1 and TE2 of the first transistor T1.

The second interlayer insulating layer ILD2 may be disposed on the first conductive layer CP1.

A second conductive layer CP2 may be disposed on the second interlayer insulating layer ILD2. The second conductive layer CP2 may include a bridge pattern BRP and the second power line PL2 that electrically connect the pixel circuit layer PCL to the display element layer DPL. The second conductive layer CP2 may further include a line (e.g., the first power line).

The bridge pattern BRP may be electrically connected to a first pixel electrode (e.g., the first electrode ELT1) of each light source unit LSU through a first contact hole CH1 or the like that is formed in the first contactor CNT1. The second power line PL2 may be electrically connected to a last pixel electrode (e.g., the eighth electrode ELT8) of each light source unit LSU through a second contact hole CH2 or the like that may be formed in the second contactor CNT2.

The passivation layer PSV may be disposed on the second conductive layer CP2.

The display element layer DPL may be disposed on the passivation layer PSV.

The display element layer DPL may include pixel electrodes ELT (or a pixel electrode layer PE, e.g., first to eighth electrodes ELT1 to ELT8) disposed in the emission areas EMA of each pixel PXL, light emitting elements LD connected in series, parallel, or series/parallel between the pixel electrodes ELT, and contact electrodes CNE that electrically connect the pixel electrodes ELT to the light emitting elements LD. Furthermore, the display element layer DPL may include a shielding electrode SHI disposed under the pixel electrodes ELT and that covers the pixel electrodes ELT.

Although FIG. 15 illustrates one light emitting element LD, the pixel PXL may include multiple light emitting elements LD connected in the forward direction between the first and last pixel electrodes (e.g., the first and eighth electrodes ELT1 and ELT8). Therefore, hereinafter, each embodiment will be described on the assumption that the pixel PXL includes multiple light emitting elements LD.

Furthermore, the display element layer DPL may include a separate or integral bank pattern BNP that protrudes an area of each of the pixel electrodes ELT upward, e.g., in the third direction DR3, and/or a bank BNK which encloses the pixel area PXA.

The pixel electrodes ELT of each pixel PXL may be disposed over the bank pattern BNP. Any one of the pixel electrodes ELT, e.g., the first electrode ELT1, may be electrically connected to the bridge pattern BRP through the first contactor CNT1 (or the first contact hole CH1). Another one of the pixel electrodes ELT, e.g., the eighth electrode ELT8, may be electrically connected to the second power line PL2 through the second contactor CNT2 (or the second contact hole CH2).

In embodiments, the shielding electrode SHI may be disposed under the bank pattern BNP such that the shielding electrode SHI overlaps the pixel electrodes ELT of each pixel PXL. The shielding electrode SHI may have a size (or a surface area) greater than that of the pixel electrodes ELT, in a plan view, and thus cover the pixel electrodes ELT. For example, the first shielding electrode SHI1 may be disposed under the first electrode ELT1 and cover the first electrode ELT1. The second shielding electrode SHI2 may be disposed under the second electrode ELT2 and cover the second electrode ELT2. An eighth shielding electrode SHI8 may be disposed under the eighth electrode ELT8 and cover the eighth electrode ELT8.

The first insulating layer INS1 may be disposed on the pixel electrodes ELT. The bank BNK may be disposed on the first insulating layer INS1.

In an embodiment, at least some of the light emitting elements LD may be disposed between one pair of adjacent pixel electrodes ELT such that the opposite ends thereof (e.g., the first and second ends EP1 and EP2 thereof) with respect to the longitudinal direction overlap or do not overlap the one pair of pixel electrodes ELT. Furthermore, the opposite ends (e.g., the first and second ends EP1 and EP2) of the light emitting elements LD may directly contact the respective pixel electrodes ELT, or be electrically connected to the respective pixel electrodes ELT through the corresponding contact electrodes CNE.

The second insulating layer INS2 may be disposed on partial areas of the light emitting elements LD. The second insulating layer INS2 may be sectionally disposed on the respective partial areas of the light emitting elements LD such that the first and second ends EP1 and EP2 of each of the light emitting elements LD may be exposed.

As described above, the light emitting elements LD may also be supplied to the non-emission area NEA during a process of supplying the light emitting elements LD into the emission area EMA. In case that conductors (e.g., the first and second conductive layers CP1 and CP2) are present in the non-emission area NEA, the light emitting elements LD may be abnormally aligned even in the non-emission area NEA by signal interference of the conductors. Such abnormal alignment of the light emitting elements LD may be prevented by the shielding electrode SHI.

The opposite ends of the light emitting elements LD, e.g., the first and second ends EP1 and EP2, which may not be covered with the second insulating layer INS2, may be covered with the respective contact electrodes CNE, and be electrically connected to the respective pixel electrodes ELT by the corresponding contact electrodes CNE.

In an embodiment, as illustrated in FIG. 15, two contact electrodes CNE (e.g., first and second contact electrodes CNE1 and CNE2) that face each other with each light emitting element LD provided therebetween may be separately disposed on different layers. The display element layer DPL may include a third insulating layer INS3 interposed between the contact electrodes CNE. The third insulating layer INS3 may be disposed to cover any one of a pair of contact electrodes CNE (e.g., the first contact electrode CNE1). In case that the second insulating layer INS2 and/or the third insulating layer INS3 is formed between a pair of contact electrodes CNE, the contact electrodes CNE may be reliably separated from each other, so that a short-circuit defect may be prevented from occurring between the first and second ends EP1 and EP2 of the light emitting elements LD.

In an embodiment, as described with reference to FIG. 10, two contact electrodes CNE (e.g., first and second contact electrodes CNE1 and CNE2) that face each other with each light emitting element LD provided therebetween may be disposed on the same layer. In case that the contact electrodes CNE are disposed on the same layer, the contact electrodes CNE may be simultaneously formed through the same process. A process of fabricating the pixel PXL and the display device including the pixel PXL may be simplified.

The fourth insulating layer INS4 may be disposed on the contact electrodes CNE and/or the third insulating layer INS3. For example, the fourth insulating layer INS4 may be formed on an overall surface of the substrate SUB to cover the bank pattern BNP, the pixel electrodes ELT, the insulating layers INS1, INS2, and INS3, the light emitting elements LD, the contact electrodes CNE, and/or the bank BNK.

As described, the pixel PXL may include the shielding electrode SHI which overlap the pixel electrodes ELT and cover the pixel electrodes ELT from the conductors (e.g., the first and second conductive layers CP1 and CP2) provided thereunder, so that signal interference resulting from the conductors may be minimized in case that the light emitting elements LD are aligned. Consequently, the degree of alignment of the light emitting elements LD may be enhanced.

FIGS. 16 to 20 are diagrams schematically illustrating a method of fabricating the display device in accordance with embodiments. FIGS. 16 to 20 are sectional views corresponding to FIG. 13. Although, for the sake of explanation, some components (e.g., the substrate SUB, the buffer layer BFL, the gate insulating layer GI, the gate electrode GE, and the first interlayer insulating layer ILD1 illustrated in FIGS. 9, 10, and 15) of the pixel PXL (or the display panel PNL), it should be understood that the display device illustrated in FIGS. 16 to 20 includes the foregoing components.

Figure 16:
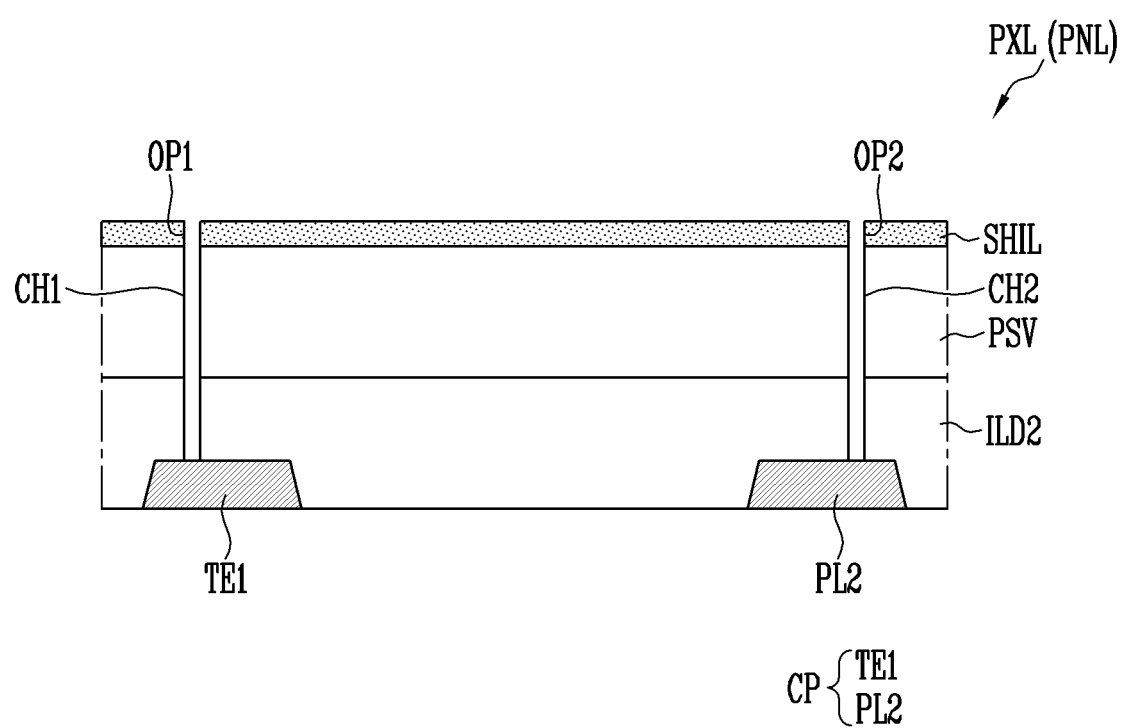
FIGS. 16 to 20 are diagrams schematically illustrating a method of fabricating the display device in accordance with embodiments.

Referring to FIGS. 13 and 16, a panel (or the display panel PNL) formed by successively stacking the conductive layer CP (e.g., the conductive layer CP disposed on the first interlayer insulating layer ILD1 illustrated in FIGS. 9 and 10), the second interlayer insulating layer ILD2, and the passivation layer PSV may be prepared.

A shielding electrode layer SHIL (or a first electrode layer) may be formed on the passivation layer PSV of the panel. The shielding electrode layer SHIL may be formed to cover the overall area of the upper surface of the passivation layer PSV. The shielding electrode layer SHIL may include the same material as that of the shielding electrode SHI described with reference to FIG. 9. For example, the shielding electrode layer SHIL may include titanium (Ti).

As illustrated in FIG. 16, the first and second contact openings OP1 and OP2 and the first and second contact holes CH1 and CH2 may be formed through an etching process. The first and second contact openings OP1 and OP2 may pass through the shielding electrode layer SHIL. The first and second contact holes CH1 and CH2 may pass through the passivation layer PSV and the second interlayer insulating layer ILD2. For example, the first transistor electrode TE1 may be exposed through the first contact opening OP1 and the first contact hole CH1. The second power line PL2 may be exposed through the second contact opening OP2 and the second contact hole CH2.

For example, the first and second contact openings OP1 and OP2 and the first and second contact holes CH1 and CH2 may be simultaneously formed through a dry etching process. For example, opening patterns corresponding to the first and second contact holes CH1 and CH2 may be formed by applying a photoresist onto the shielding electrode layer SHIL and etching portions of the photoresist. The first and second contact openings OP1 and OP2 and the first and second contact holes CH1 and CH2 may be simultaneously formed by performing the dry etching process using the photoresist including the opening patterns.

Figure 17:
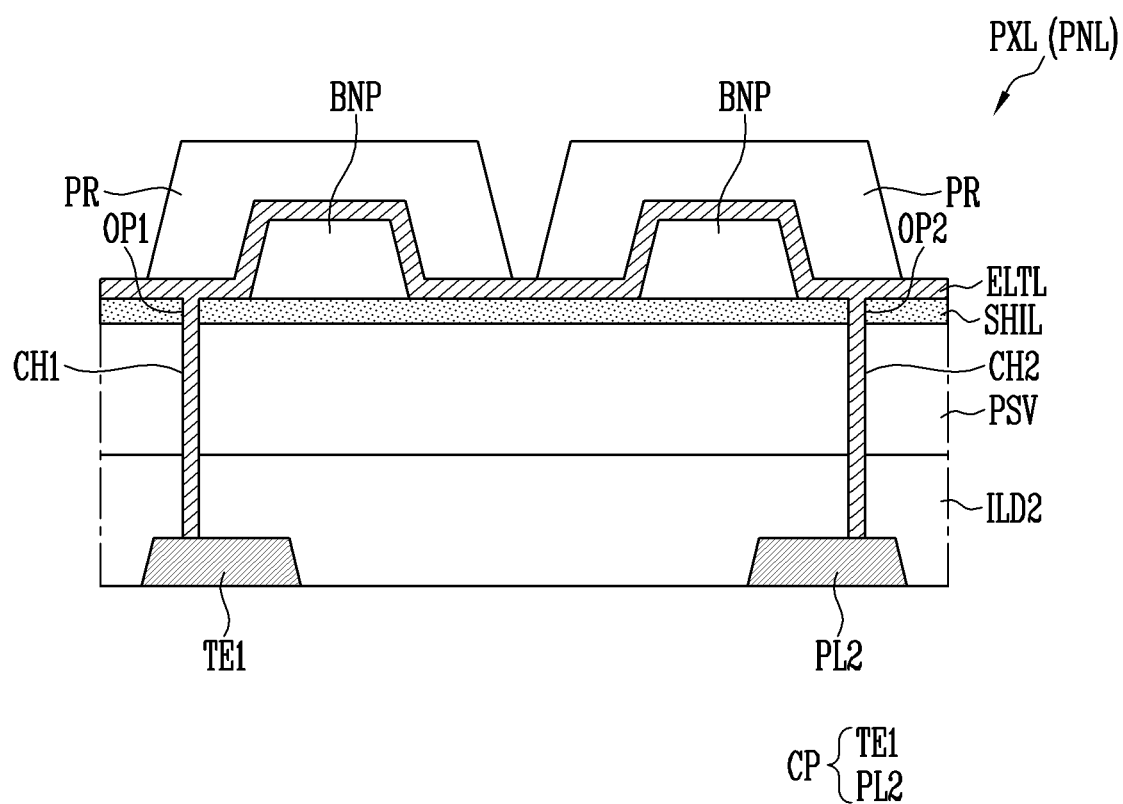

Referring to FIG. 17, a bank pattern BNP, an electrode layer ELTL (or the second electrode layer), and a mask PR (or a photoresist) may be successively formed or patterned on the shielding electrode layer SHIL.

For example, a pair of bank patterns BNP may be formed on the shielding electrode layer SHIL. Thereafter, the electrode layer ELTL may be formed to cover the bank patterns BNP and the shielding electrode layer SHIL. The electrode layer ELTL may include the same material as that of the first and second electrodes ELT1 and ELT2 described with reference to FIG. 9. For example, the electrode layer ELTL may include aluminum (Al). The electrode layer ELTL may be brought into contact with or connected to the first transistor electrode TE1 through the first contact opening OP1 and the first contact hole CH1, and may be brought into contact with or connected to the second power line PL2 through the second contact opening OP2 and the second contact hole CH2. Thereafter, a photoresist layer may be formed on the shielding electrode layer SHIL. The mask PR may be formed through a photo process for the photoresist layer.

Figure 18:
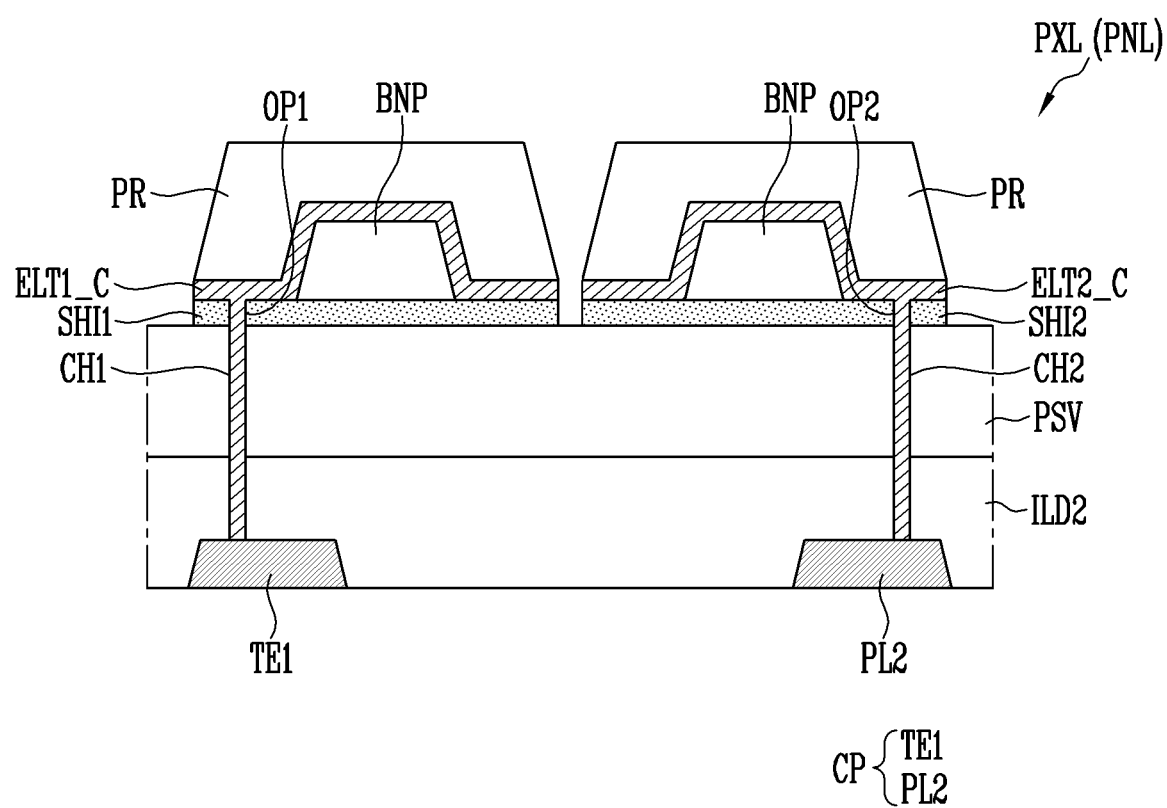

Referring to FIG. 18, first and second electrodes ELT1_C and ELT2_C (or first and second intermediate electrodes) and first and second shielding electrodes SHI1 and SHIE2 may be formed through a primary etching process. For example, the first and second electrodes ELT1_C and ELT2_C and the first and second shielding electrodes SHI1 and SHI2 may be simultaneously formed through a dry etching process.

For example, the first and second electrodes ELT1_C and ELT2_C may be formed by etching portions of the electrode layer ELTL that may-be exposed from the mask PR. The first and second shielding electrodes SHI1 and SHI2 may be formed by etching portions of the shielding electrode layer SHIL that may be exposed from the mask PR (and the first and second electrodes ELT1_C and ELT2_C).

A distance between the first and second electrodes ELT1_C and ELT2_C and a distance between the first and second shielding electrodes SHI1 and SHI2 may correspond to the first distance D1 described with reference to FIGS. 7 and 8. For example, the distance between the first and second electrodes ELT1_C and ELT2_C and the distance between the first and second shielding electrodes SHI1 and SHI2 may be about 1 µm.

Figure 19:
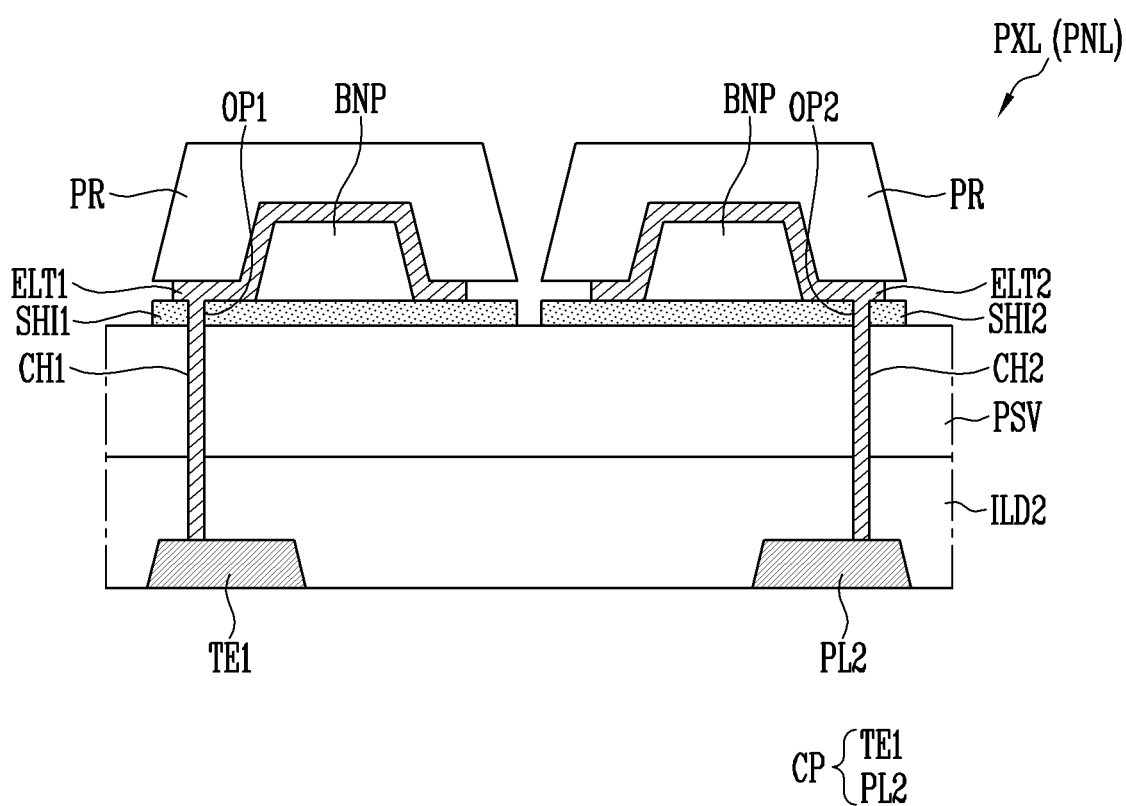

Referring to FIG. 19, the first and second electrodes ELT1 and ELT2 may be formed through a secondary etching process. For example, the first and second electrodes ELT1 and ELT2 may be formed by additionally etching the first and second electrodes ELT1_C and ELT2_C through a wet etching process. A distance between the first and second electrodes ELT1 and ELT2 may correspond to the second distance D2 described with reference to FIGS. 7 and 8. For example, the distance between the first and second electrodes ELT1 and ELT2 may be about 3.5 µm. In other words, a sufficiently large distance may be secured between the first and second electrodes ELT1 and ELT2 through the secondary etching process.

In an embodiment, the first and second electrodes ELT1_C and ELT2_C (or the electrode layer ELTL) may have a relatively high selectivity for the wet etching, compared to that of the first and second shielding electrodes SHI1 and SHI2 (or the shielding electrode layer SHIL). During the secondary etching process, the first and second shielding electrodes SHI1 and SHI2 (or the shielding electrode layer SHIL) may not be etched, and only the first and second electrodes ELT1_C and ELT2_C (or the electrode layer ELTL) may be etched. As described above, the first and second shielding electrodes SHI1 and SHI2 (or the shielding electrode layer SHIL) may include titanium (Ti), and the first and second electrodes ELT1_C and ELT2_C (or the electrode layer ELTL) may include aluminum (Al).

Figure 20:
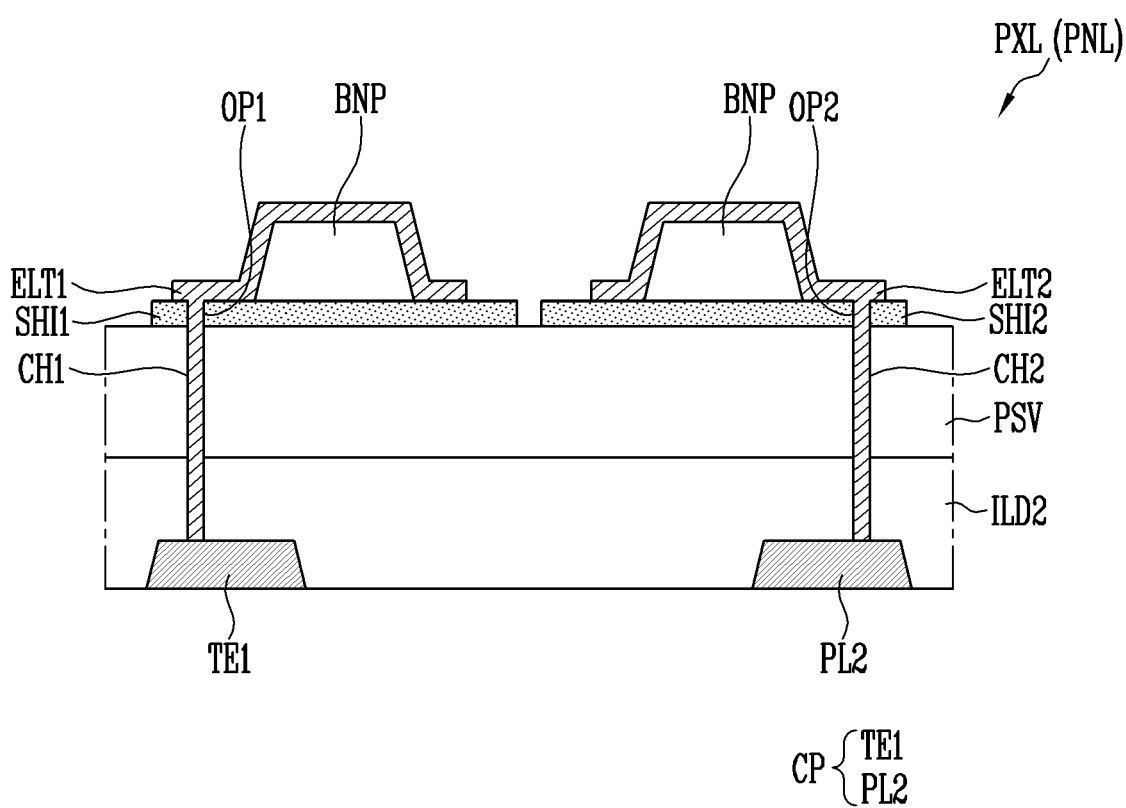

Referring to FIG. 20, the mask PR may be stripped.

Thereafter, as illustrated in FIG. 13, the light emitting elements LD may be aligned to be electrically connected between the first and second electrodes ELT1 and ELT2 (or the bank patterns BNP). In an embodiment, as illustrated in FIGS. 9, 10, and 15, the first insulating layer INS1 may be formed before the alignment of the light emitting elements LD. The bank BNK may be formed on the first insulating layer INS1. A solution including the light emitting elements LD may be input to space formed between portions of the bank BNK.

The solution including the light emitting elements LD may be sprayed onto the first electrode ELT1 and the second electrode ELT2 by an inkjet scheme or the like.

If alignment voltages (or alignment signals) may be applied to the first electrode ELT1 and the second electrode ELT2 after the solution has been sprayed, an electric field may be formed between the first electrode ELT1 and the second electrode ELT2, so that the light emitting elements LD may be aligned between the first electrode ELT1 and the second electrode ELT2. After the light emitting elements LD have been aligned, the solution may be removed by a volatilization scheme or other schemes. In this way, the light emitting elements LD may be reliably arranged between the first electrode ELT1 and the second electrode ELT2.

Since the first electrode ELT1 may be electrically connected to the first transistor electrode TE1 and the second electrode ELT2 may be electrically connected to the second power line PL2, an electric field may be formed between the first electrode ELT1 and the second power line PL2 and/or between the second electrode ELT2 and the first transistor electrode TE1 in case that alignment voltages are applied to the first electrode ELT1 and the second electrode ELT2. Here, the first shielding electrode SHI1 may be disposed between the first electrode ELT1 and the first transistor electrode TE1, and the second shielding electrode SHI2 may be disposed between the second electrode ELT2 and the second power line PL2, so that the electric field may be blocked. Therefore, misalignment of the light emitting element LD attributable to the electric field may be prevented from occurring.

As illustrated in FIGS. 9, 10, and 15, the second insulating layer INS2, the first contact electrode CNE1, the third insulating layer INS3, the second contact electrode CNE2, and the fourth insulating layer INS4 may be successively formed. The light emitting elements LD may be electrically connected to the first electrode ELT1 by the first contact electrode CNE1, and electrically connected to the second electrode ELT2 by the second contact electrode CNE2.

As described above, the first and second shielding electrodes SHI1 and SHI2 and the first and second electrodes ELT1 and ELT2 may be simultaneously formed by using one mask PR. Furthermore, only the first and second electrodes ELT1 and ELT2 may be additionally etched through the second etching process (e.g., a wet etching process), so that a sufficiently large distance between the first and second electrodes ELT1 and ELT2 may be secured, and the first and second shielding electrodes SHI1 and SHI2 that may not be additionally etched may cover the first and second electrodes ELT1 and ELT2 from lower components (e.g., the first transistor electrode TE1 and the second power line PL2). Compared to the case where an additional mask is used to form the first and second shielding electrodes SHI1 and SHI2 between which a distance is different from the distance between the first and second electrodes ELT1 and ELT2, the fabricating process may be facilitated, and the production cost may be reduced.

A display device in accordance with an embodiment of the disclosure may include first and second shielding electrodes which may be respectively disposed under first and second electrodes (or first and second pixel electrodes). Therefore, the first and second shielding electrodes may block an electric field or an electric field interference from occurring between a lower conductor and the first and second electrodes, so that misalignment of a light emitting element resulting from the electric field or the electric field interference can be prevented from being caused. Accordingly, the degree of alignment of the light emitting element may be improved.

Furthermore, in a method of fabricating the display device in accordance with an embodiment of the disclosure, the shielding electrodes and the electrodes (or the pixel electrodes) may be simultaneously formed using one mask. Only the electrodes may be additionally etched through a secondary etching process (e.g., a wet etching process) so that a sufficiently large distance between the electrodes may be secured. Therefore, compared to the case where an additional mask is used to form the first and second shielding electrodes between which a distance is different from the distance between the first and second electrodes, the fabricating process may be facilitated, and the production cost may be reduced.

The effects of the disclosure are not limited by the foregoing, and other various effects are anticipated herein.

While various embodiments have been described above, those skilled in the art will appreciate that various modifications, additions and substitutions are possible, without departing from the scope and spirit of the disclosure.

Therefore, the embodiments disclosed in this specification are only for illustrative purposes rather than limiting the technical spirit of the disclosure. The scope of the disclosure should be interpreted to include modifications, additions, and substitutions.

What is claimed is:

1. A display device comprising:
a conductive pattern disposed on a substrate;
a passivation layer disposed on the conductive pattern;
a first shielding electrode and a second shielding electrode that are disposed on the passivation layer and spaced apart from each other;
a first electrode disposed on the first shielding electrode;
a second electrode disposed on the second shielding electrode; and
a light emitting element electrically connected between the first electrode and the second electrode,
wherein a first distance between the first shielding electrode and the second shielding electrode is less than a second distance between the first electrode and the second electrode.

2. The display device according to claim 1, wherein the first distance between the first shielding electrode and the second shielding electrode is less than about one-third (⅓) of a length of the light emitting element.

3. The display device according to claim 2, wherein the first distance between the first shielding electrode and the second shielding electrode is about 1 μm.

4. The display device according to claim 2, wherein the second distance between the first electrode and the second electrode is greater than about three-fourths (¾) of the length of the light emitting element.

5. The display device according to claim 4, wherein the second distance between the first electrode and the second electrode is about 3.5 μm.

6. The display device according to claim 1, wherein a thickness of the first shielding electrode ranges from about 500 Å to about 1000 Å.

7. The display device according to claim 1, wherein an electrical conductivity of each of the first and the second shielding electrodes is less than an electrical conductivity of each of the first and the second electrodes.

8. The display device according to claim 7, wherein
the first and the second shielding electrodes include titanium, and
the first and the second electrodes include aluminum.

9. The display device according to claim 1, wherein
the first electrode contacts the first shielding electrode, and
the second electrode contacts the second shielding electrode.

10. The display device according to claim 1, further comprising:
bank patterns disposed between the first electrode and the first shielding electrode and between the second electrode and the second shielding electrode,
wherein, in a plan view, the light emitting element is disposed between the bank patterns.

11. The display device according to claim 10, wherein
the bank patterns have a top surface and a bottom surface opposing the top surface,
the top surface of each of the bank patterns being in direct contact with one of the first electrode or the second electrode, and
the bottom surface of each of the bank patterns being in direct contact with one of the first shielding electrode or second shielding electrode.

12. The display device according to claim 1, wherein
the conductive pattern comprises a power line, and
the second electrode passes through the second shielding electrode and contacts the power line.

13. The display device according to claim 1, wherein, in a plan view, a distance between a side of the second shielding electrode and a corresponding side of the second electrode is constant in an extension direction of the second electrode.

14. The display device according to claim 1, wherein the second distance between the first electrode and the second electrode is about 3.5 μm.

15. The display device according to claim 1, wherein the first electrode directly contacts the conductive pattern.

16. The display device according to claim 1, wherein each of the first electrode and the second electrode directly contacts the conductive pattern through a hole in the first shielding electrode and the second shielding electrode, respectively.

17. The display device according to claim 1, wherein the first electrode is an anode of the light emitting element and the second electrode is a cathode of the light emitting element.

\* \* \* \* \*